(12) United States Patent
Lo et al.

(10) Patent No.: US 11,355,430 B2
(45) Date of Patent: Jun. 7, 2022

(54) CAPPING LAYER OVERLYING DIELECTRIC STRUCTURE TO INCREASE RELIABILITY

(71) Applicant: Taiwan Semiconductor Manufacturing Co., Ltd., Hsin-Chu (TW)

(72) Inventors: Ting-Ya Lo, Hsin-Chu (TW); Chi-Lin Teng, Taichung (TW); Hai-Ching Chen, Hsinchu (TW); Hsin-Yen Huang, New Taipei (TW); Shau-Lin Shue, Hsinchu (TW); Shao-Kuan Lee, Kaohsiung (TW); Cheng-Chin Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/885,378

(22) Filed: May 28, 2020

(65) Prior Publication Data
US 2021/0193566 A1     Jun. 24, 2021

Related U.S. Application Data

(60) Provisional application No. 62/949,560, filed on Dec. 18, 2019.

(51) Int. Cl.
*H01L 23/522* (2006.01)
*H01L 23/538* (2006.01)
*H01L 21/768* (2006.01)

(52) U.S. Cl.
CPC .... *H01L 23/5222* (2013.01); *H01L 21/76802* (2013.01); *H01L 21/76831* (2013.01); *H01L 23/5384* (2013.01); *H01L 23/5386* (2013.01)

(58) Field of Classification Search
CPC .......... H01L 21/7682; H01L 21/76834; H01L 21/76831; H01L 21/76897; H01L 23/5222;
(Continued)

(56) References Cited

U.S. PATENT DOCUMENTS

| 6,265,321 | B1 * | 7/2001 | Chooi | ................. H01L 21/7682 257/E21.579 |
| 7,405,147 | B2 * | 7/2008 | Edelstein | .......... H01L 21/76829 438/618 |

(Continued)

*Primary Examiner* — Jaehwan Oh
*Assistant Examiner* — John M Parker
(74) *Attorney, Agent, or Firm* — Eschweiler & Potashnik, LLC

(57) ABSTRACT

Some embodiments relate to a semiconductor structure including an inter-level dielectric (ILD) layer overlying a substrate. A conductive via is disposed within the ILD layer. A plurality of conductive wires overlie the ILD layer. The plurality of conductive wires includes a first conductive wire laterally offset a second conductive wire. A dielectric structure is disposed laterally between the first and second conductive wires. The dielectric structure includes a first dielectric liner, a dielectric layer, and an air-gap. The air-gap is disposed between an upper surface of the first dielectric liner and a lower surface of the dielectric layer. A dielectric capping layer is disposed along an upper surface of the dielectric structure. The dielectric capping layer continuously extends between opposing sidewalls of the dielectric structure and is laterally offset from the plurality of conductive wires.

20 Claims, 15 Drawing Sheets

(58) Field of Classification Search
CPC ........... H01L 23/53295; H01L 23/5329; H01L 23/528
See application file for complete search history.

(56) References Cited

U.S. PATENT DOCUMENTS

| | | | | |
|---|---|---|---|---|
| 7,871,923 | B2* | 1/2011 | Liu | H01L 21/76831 |
| | | | | 438/622 |
| 9,711,455 | B2* | 7/2017 | Gates | H01L 21/7682 |
| 10,665,546 | B1* | 5/2020 | Lin | H01L 23/5222 |
| 10,796,949 | B2* | 10/2020 | Topaloglu | H01L 23/5222 |
| 2015/0076705 | A1* | 3/2015 | Singh | H01L 21/76835 |
| | | | | 257/774 |
| 2016/0093566 | A1* | 3/2016 | Ting | H01L 23/5329 |
| | | | | 257/774 |
| 2016/0141206 | A1* | 5/2016 | Bouche | H01L 21/76897 |
| | | | | 257/774 |
| 2018/0130697 | A1* | 5/2018 | Jang | H01L 21/76843 |
| 2018/0261544 | A1* | 9/2018 | Kim | H01L 23/5222 |
| 2019/0237356 | A1* | 8/2019 | Srivastava | H01L 23/528 |
| 2020/0185264 | A1* | 6/2020 | Lin | H01L 21/76877 |
| 2021/0066187 | A1* | 3/2021 | Lee | H01L 21/76897 |

* cited by examiner

CAPPING LAYER OVERLYING DIELECTRIC STRUCTURE TO INCREASE RELIABILITY

REFERENCE TO RELATED APPLICATION

This Application claims the benefit of U.S. Provisional Application No. 62/949,560, filed on Dec. 18, 2019, the contents of which are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the resulting capacitance increases, which will increase power consumption and time delay.

To reduce parasitic capacitance and correspondingly improve device performance, IC designers utilize low-k dielectrics. One kind of low-k dielectric is produced by doping silicon oxide (SiO2) with impurities. For example, while pure SiO2 has a dielectric constant of 3.9, fluorinated silica glass in which SiO2 has been doped with fluorine has a dielectric constant of 3.5. Further, SiO2 which has been doped with carbon can have a dielectric constant that is further lowered to about 3.0. Another kind of low-k material is produced by creating large voids or pores in a dielectric. Voids can have a dielectric constant of nearly 1, thereby reducing the dielectric constant of the porous material by increasing the porosity of the material. Large pores, also referred to as air-gaps, can provide an extremely low-k dielectric between the two conductive features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
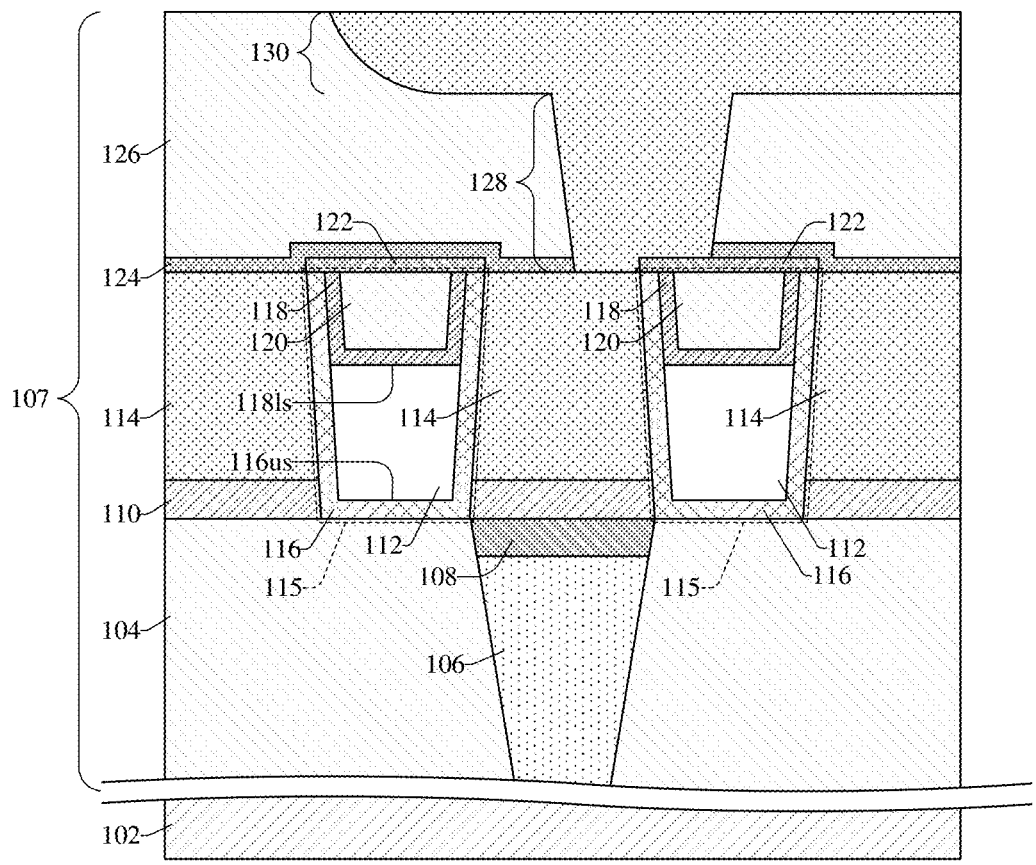
FIG. 1 illustrates a cross-sectional view of some embodiments of an integrated chip having a dielectric capping layer overlying a dielectric structure that is disposed between adjacent conductive wires.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, memory devices, etc.) disposed over and/or within a semiconductor substrate. An interconnect structure may be disposed over the semiconductor substrate. The interconnect structure may include conductive interconnect layers having conductive wires and conductive vias disposed within an interconnect dielectric structure. The conductive wires and conductive vias are configured to provide electrical pathways between different semiconductor devices disposed within and/or over the semiconductor substrate. Further, air-gaps are formed in the interconnect dielectric structure between adjacent conductive features, for example between two adjacent conductive wires, to lower a k-value of the interconnect dielectric structure. By reducing the k-value of the interconnect dielectric structure, the air-gaps can reduce a capacitance and reduce a resistance capacitance (RC) delay in the interconnect structure.

The conductive interconnect layers of the interconnect structure may be formed by a single or dual damascene process. For example, a layer of lower conductive vias may be formed within a lower inter-level dielectric (ILD) layer over the semiconductor substrate by a single damascene process. Subsequently, a conductive layer is formed over the lower ILD layer. A patterning process is performed on the conductive layer to define a plurality of conductive wires such that a plurality of openings are disposed between the plurality of conductive wires. A dielectric liner is formed over the conductive wires, thereby lining the plurality of openings. A low-k dielectric structure is formed over the conductive wires and fills the plurality of openings. A planarization process is performed into the low-k dielectric structure, thereby defining a plurality of dielectric structures disposed between adjacent conductive wires. Subsequently, an upper conductive via is formed over a first conductive wire in the plurality of conductive wires. However, during fabrication of the upper conductive via, there may be a misalignment of a photomask over the first conductive wire (e.g., used in a photolithography system) such that the upper conductive via extends from a top surface of the first conductive wire to a sidewall of the first conductive wire.

The misalignment may occur due to limitations of tools used in the photolithography system and the misalignment may increase as a size of each conductive wire decreases (e.g., as the integrated chip is scaled down).

As the size of conductive features disposed within the interconnect structure are decreased to increase a number of devices disposed over the semiconductor substrate, a capacitance and a resistance capacitance (RC) delay in the interconnect structure increases. For example, the dielectric liner has a relatively high dielectric constant (e.g., greater than 4.5) and the low-k dielectric structure has a low dielectric constant (e.g., about 2.3). This results in a large capacitance between adjacent conductive wires. The capacitance increases as the distance between the conductive wires is decreased. Further, due to the misalignment, a center of the upper conductive via may be laterally offset from a center of the first conductive wire, such that the upper conductive via extends along the sidewall of the first conductive wire. The misalignment may cause damage (e.g., delamination) to the low-k dielectric structure and/or the dielectric liner. In addition, the misalignment may result in current leakage between adjacent conductive wires, thereby reducing a performance of the integrated chip.

Accordingly, some embodiments of the present disclosure are related to an interconnect structure comprising a dielectric capping layer overlying a dielectric structure that is spaced between adjacent conductive wires. The dielectric structure comprises an air-gap configured to lower a capacitance between the adjacent conductive wires. Further, a method for forming the interconnect structure according to the present disclosure includes forming a lower conductive via within a first ILD layer. A plurality of conductive wires are formed over the first ILD layer such that openings are disposed between the conductive wires. A first dielectric liner is formed along the conductive wires such that it lines the openings. A sacrificial layer is formed between adjacent conductive wires such that it partially fills each opening. Subsequently, a second dielectric liner is formed within the openings and contacts the sacrificial layer. A removal process is performed to remove the sacrificial layer, thereby forming air-gaps between adjacent conductive wires. A dielectric layer is formed over the second dielectric liner, thereby defining a dielectric structure between adjacent conductive wires. The dielectric structure includes the air-gap, dielectric layer, and first and second dielectric liners. A dielectric capping layer is selectively formed along a top surface of the dielectric layer and the first dielectric liner, where the dielectric capping layer is laterally offset from the conductive wires. Finally, an upper conductive via is formed over a first conductive wire. In some embodiments, during formation of the upper conductive via there may be misalignment, such that the upper conductive via extends continuously from a top surface of the dielectric capping layer to a top surface of the first conductive wire. The dielectric capping layer may act as an etch stop layer during formation of the upper conductive via, such that an etching process used to form the upper conductive via may not over-etch into the dielectric layer, the first dielectric liner, and/or the second dielectric layer and expose a sidewall of the first conductive wire. This may mitigate damage to dielectric materials between adjacent conductive wires and reduces current leakage. In addition, the air-gaps between the adjacent conductive wires may reduce a capacitance and an RC delay in the interconnect structure, thereby increasing a performance of the integrated chip.

FIG. 1 illustrates a cross-sectional view of some embodiments of an integrated chip 100 having a dielectric capping layer 122 overlying a plurality of dielectric structures 115 that are disposed laterally between adjacent conductive wires 114.

The integrated chip 100 includes an interconnect structure 107 overlying a substrate 102. The interconnect structure 107 includes an interconnect dielectric structure, a conductive contact 106, a plurality of conductive wires 114, an upper conductive via 128, and an upper conductive wire 130. In further embodiments, the interconnect structure 107 may be referred to as a back-end-of-the-line (BEOL) structure such that the conductive contact 106 is disposed within a first BEOL metallization layer, the conductive wires 114 are disposed within a second BEOL metallization layer, etc. In some embodiments, the interconnect dielectric structure includes a first inter-level dielectric (ILD) layer 104, the dielectric structures 115, an etch stop layer 124, and a second ILD layer 126. A conductive capping layer 108 overlies the conductive contact 106 and is disposed within the first ILD layer 104. In some embodiments, the conductive capping layer 108 may be configured as a diffusion barrier layer configured to prevent diffusion of a diffusive species (e.g., copper and/or aluminum) from the conductive contact 106 to adjacent structures.

An adhesion layer 110 is disposed under each conductive wire 114. In some embodiments, the adhesion layer 110 is configured to prevent delamination between the conductive wire 114 and underlying structures and/or layers (e.g., the conductive capping layer 108), thereby increasing a reliability of the interconnect structure 107. In some embodiments, a minimum width of the conductive wires 114 is greater than a minimum width of the conductive contact 106. A plurality of dielectric structures 115 is disposed laterally between adjacent conductive wires 114. Each dielectric structure 115 includes a first dielectric liner 116, a second dielectric liner 118, an air-gap 112, and a dielectric layer 120. The first dielectric liner 116 extends along sidewalls of adjacent conductive wires 114 and an upper surface of the first ILD layer 104. The air-gap 112 is disposed between an upper surface 116$us$ of the first dielectric liner 116 and a lower surface 118$ls$ of the second dielectric liner 118. In some embodiments, the air-gaps 112 may be referred to as voids, pores, openings, or the like. The air-gaps 112 are disposed between adjacent conductive wires 114 and are configured to reduce an overall k-value of the interconnect dielectric structure. For example, the air-gaps 112 may reduce the k-value of the dielectric structures 115, thereby reducing a capacitance between the adjacent conductive wires and improving an RC delay in the interconnect structure 107.

The dielectric capping layer 122 is disposed along an upper surface of each dielectric structure 115. The etch stop layer 124 continuously extends along an upper surface of each conductive wire 114 to an upper surface of the dielectric capping layer 122. A second ILD layer 126 overlies the etch stop layer 124. The upper conductive via 128 and the upper conductive wire 130 are disposed within the second ILD layer 126 and overlie an underlying conductive wire 114. In some embodiments, the upper conductive via and wire 128, 130 comprise a single conductive body.

In some embodiments, during fabrication of the upper conductive via and wire 128, 130, an etching process is performed into the second ILD layer 126 and the etch stop layer 124. The etching process may expose an upper surface of the underlying conductive wire 114 and form a conductive feature opening above the underlying conductive wire 114. However, the etching process may also expose an upper surface of the dielectric capping layer 122. This, in part, may be due to an overlay mismatch between the underlying conductive wire 114 and a masking layer (not shown) utilized to perform the etching process. During the etching process the dielectric capping layer 122 is etched more slowly than the etch stop layer 124 and the second ILD layer 126, such that the etching process does not over-etch into the dielectric structure 115. This mitigates damage to the dielectric structure, reduces current leakage between adjacent conductive wires 114, and increases an endurance and stability of the interconnect structure 107. Subsequently, the upper conductive via and wire 128, 130 may be formed within the conductive feature opening, such that the upper conductive via 128 continuously extends from the upper surface of the dielectric capping layer 122 to the upper surface of the underlying conductive wire 114.

Figure 2A:
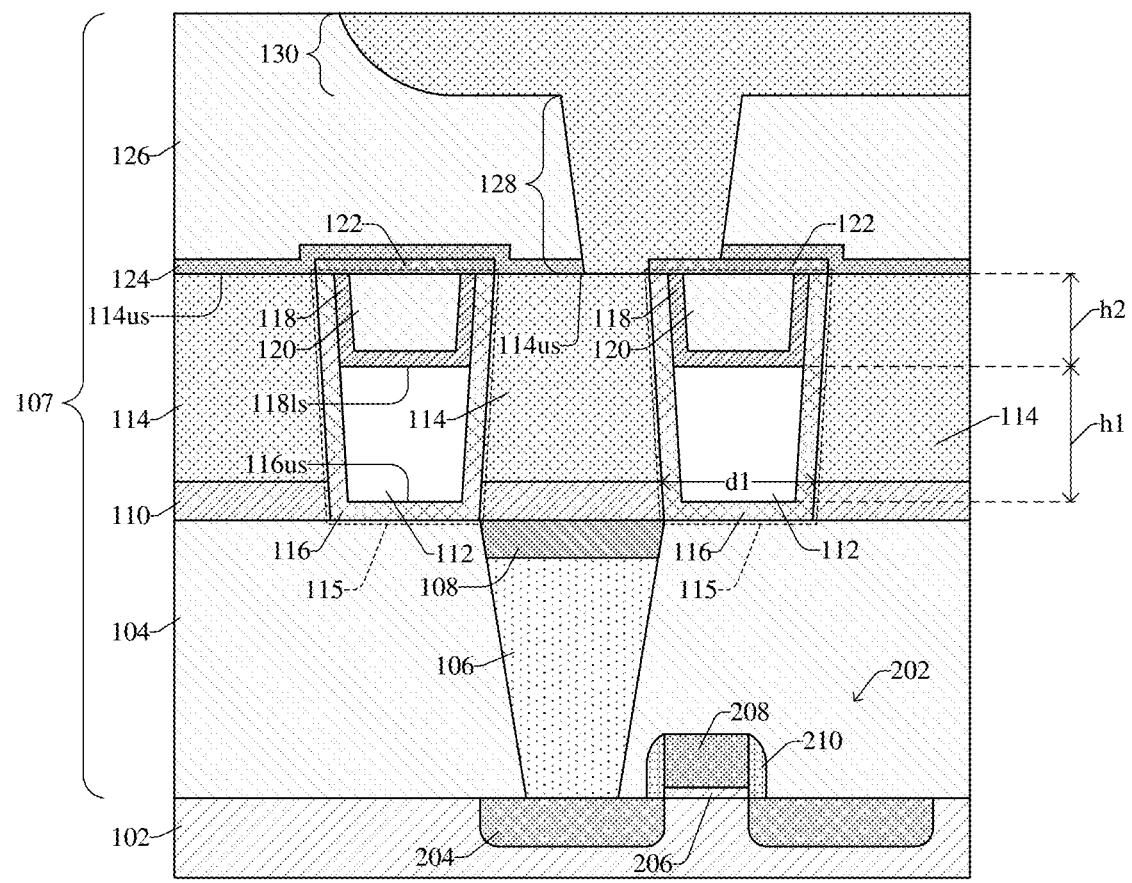
FIGS. 2A, 2B, and 3 illustrate cross-sectional views of some alternative embodiments of the integrated chip of FIG. 1.

FIG. 2A illustrates a cross-sectional view of some embodiments of an integrated chip 200a according to some alternative embodiments of the integrated chip 100 of FIG. 1.

The integrated chip 200a includes an interconnect structure 107 overlying a substrate 102. The interconnect structure 107 includes metallization layers (e.g., the conductive contact 106, the conductive wires 114, the upper conductive via 128, and/or the upper conductive wire 130) disposed within an interconnect dielectric structure. The metallization layers are configured to electrically couple a semiconductor device 202 disposed within and/or over the substrate 102 to other semiconductor devices (not shown) and/or doped regions (not shown) disposed within and/or over the substrate 102. In some embodiments, the substrate 102 may, for example, be or comprise a bulk semiconductor substrate (e.g., bulk silicon), a silicon-on-insulator (SOI) substrate, or another suitable substrate material. The interconnect dielectric structure includes the first ILD layer 104, the dielectric structures 115, the etch stop layer 124, and the second ILD layer 126. In some embodiments, the semiconductor device 202 may be configured as a transistor. In such embodiments, the semiconductor device 202 comprises source/drain regions 204 disposed within the substrate 102, a gate dielectric layer 206 overlying the substrate 102, a gate electrode 208 overlying the gate dielectric layer 206, and a sidewall spacer structure 210 laterally enclosing the gate dielectric layer 206 and the gate electrode 208. The source/drain regions 204 are disposed on opposite sides of the gate electrode 208. It will be appreciated that the semiconductor device 202 being configured as another semiconductor device is also within the scope of the disclosure.

In some embodiments, the conductive contact 106 is disposed within the first ILD layer 104 and a conductive capping layer 108 is disposed over the conductive contact 106. In further embodiments, the conductive contact 106 may directly overlying and/or be directly electrically coupled to a source/drain region 204 of the semiconductor device 202. In yet further embodiments, the conductive contact 106 may, for example, be or comprise copper, cobalt, ruthenium, molybdenum, chromium, tungsten, manganese, rhodium, nickel, palladium, platinum, silver, gold, aluminum, another conductive material, or any combination of the foregoing and/or may have a thickness within a range of about 50 to 500 or another suitable thickness value. In some embodiments, the conductive capping layer 108 is configured to mitigate diffusion of a material (e.g., copper and/or aluminum) from the conductive contact 106 to surrounding structures, such as the first ILD layer 104, the dielectric structures 115, and/or the conductive wires 114. For example, during operation and/or fabrication of the integrated chip 200a, a heat within the interconnect structure 107 may increase, thereby promoting or facilitating diffusion of the material (e.g., copper and/or aluminum) from the conductive contact 106 to the surrounding structures. By virtue of the conductive capping layer 108 extending across an upper surface of the conductive contact 106, diffusion of the material from the conductive contact 106 may be mitigated, thereby increasing a reliability of the integrated chip 200a. In further embodiments, the conductive capping layer 108 may, for example, be or comprise copper, cobalt, ruthenium, molybdenum, chromium, tungsten, manganese, rhodium, nickel, palladium, platinum, silver, gold, aluminum, another conductive material, or any combination of the foregoing and/or may have a thickness within a range of about 2 to 50 or another suitable thickness value. In yet further embodiments, the conductive capping layer 108 may comprise a different material from the conductive contact 106 and/or a thickness of the conductive capping layer 108 is less than a thickness of the conductive contact 106. In some embodiments, the first ILD layer 104 may, for example, be or comprise silicon dioxide (e.g., $SiO_2$), a low-k dielectric material, an extreme low-k dielectric material, another dielectric material, or any combination of the foregoing.

A plurality of conductive wires 114 is disposed over the first ILD layer 104. An adhesion layer 110 is disposed along a lower surface of each conductive wire 114. In some embodiments, the adhesion layer 110 is configured to facilitate good adhesion between the conductive wires 114 and an underlying structure such as the conductive capping layer 108 and/or the conductive contact 106. This, in part, may prevent delamination between the conductive wires 114 and the underlying structure, thereby increasing a reliability and/or endurance of the interconnect structure 107. In some embodiments, the adhesion layer 110 may, for example, be or comprise tantalum, titanium, tantalum nitride, titanium nitride, another conductive material, or any combination of the foregoing and/or may have a thickness within a range of about 2 to 100 angstroms or another suitable thickness value. In yet further embodiments, the adhesion layer 110 may have a thickness that is at least two times greater than a thickness of the conductive capping layer 108. In some embodiments, the adhesion layer 110 comprises a different material than the conductive capping layer 108, the conductive contacts 106, and/or the conductive wires 114. In further embodiments, the conductive wires 114 may, for example, be or comprise copper, cobalt, ruthenium, molybdenum, chromium, tungsten, manganese, rhodium, nickel, palladium, platinum, silver, gold, aluminum, another conductive material, or any combination of the foregoing and/or may have a thickness within a range of about 50 to 500 or another suitable thickness value.

In some embodiments, a plurality of dielectric structures 115 is disposed laterally between adjacent conductive wires 114. Each dielectric structure 115 includes a first dielectric liner 116, a second dielectric liner 118, an air-gap 112, and a dielectric layer 120. The first dielectric liner 116 extends along sidewalls of adjacent conductive wires 114 and an upper surface of the first ILD layer 104. In some embodiments, the first dielectric liner 116 may, for example, be or comprise silicon dioxide, silicon oxycarbide, silicon oxynitride, silicon carbon nitride, silicon carbon oxynitride, aluminum nitride, aluminum oxynitride, aluminum oxide (e.g., $Al_2O_3$), another dielectric material, or any combination of the foregoing and/or may have a thickness within a range of about 2 to 50 Angstroms or another suitable thickness value. In some embodiments, by virtue of the material and/or thickness of the first dielectric liner 116, the first dielectric liner 116 may be configured to provide good adhesion between the conductive wires 114 and adjacent structures, thereby preventing delamination between layers in the interconnect structure 107 and increasing a reliability and endurance of the integrated chip 200a.

The second dielectric liner 118 is disposed between sidewalls of the first dielectric liner 116. In some embodiments, the second dielectric liner 118 may, for example, be or comprise silicon dioxide, silicon oxycarbide, silicon oxynitride, silicon carbon nitride, silicon carbon oxynitride, another dielectric material, or any combination of the foregoing and/or may have a thickness within a range of about 2 to 100 Angstroms or another suitable thickness value. In some embodiments, by virtue of the material and/or thickness of the second dielectric liner 118, the second dielectric liner 118 may have strong structure integrity, thereby increasing robustness of the air-gap 112. This increases a reliability and endurance of the interconnect structure 107, thereby increasing a performance of the integrated chip 200a. Further, the second dielectric liner 118 laterally surrounds the dielectric layer 120 and extends continuously along a bottom surface of the dielectric layer 120. In yet further embodiments, the dielectric layer 120 may, for example, be or comprise hydrogen-containing silicon oxycarbide (SiCOH), a low-k dielectric material, an extreme low-k dielectric material, another dielectric material, or any combination of the foregoing and/or may have a thickness within a range of about 10 to 700 Angstroms or another suitable thickness value. In some embodiments, by virtue of the material and/or thickness of the dielectric layer 120, the dielectric layer 120 may be configured to provide good adhesion with the dielectric capping layer 122, thereby preventing delamination between layers in the interconnect structure 107 and further increasing a reliability and endurance of the integrated chip 200a.

Each air-gap 112 is disposed between an upper surface 116us of the first dielectric liner 116 and a lower surface 118ls of the second dielectric liner 118. In some embodiments, the air-gaps 112 may be referred to as voids, pores, openings, or the like. The air-gaps 112 are disposed between adjacent conductive wires 114 and are configured to reduce an overall k-value of the interconnect dielectric structure. In some embodiments, an effective dielectric constant of the dielectric structure 115 is a function of the dielectric materials it is comprised of and the physical structure the dielectric structure 115. For example, layers within the dielectric structure 115 may be porous and the dielectric structure 115 comprises the air-gap 112 that reduces the effective dielectric constant of the dielectric structure 115. In some embodiments, the air-gap 112 may have a dielectric constant of about 1, such that the dielectric structure 115 may have an effective dielectric constant within a range of about 1 to 2, less than 2, within a range of about 1.5 to 2.5, or another suitable dielectric constant value. This, in part may be because an area and/or volume of the air-gap 112 between adjacent conductive wires 114 is greater than an area and/or volume of the other dielectric materials (e.g., the first dielectric liner 116, the second dielectric liner 118, and/or the dielectric layer 120) between the adjacent conductive wires 114. By virtue of the relatively low effective dielectric constant (e.g., less than about 2) of the dielectric structure 115, a capacitance between the adjacent conductive wires 114 and an RC delay in the interconnect structure 107 are decreased, thereby increasing a performance of the integrated chip 200a. In some embodiments, a first height h1 of the air-gap 112 is greater than a second height h2 of the second dielectric liner 118 and the dielectric layer 120. In yet further embodiments, a width of the air-gap 112 continuously decreases from the lower surface 118ls of the second dielectric liner 118 in a direction towards the upper surface 116us of the first dielectric liner 116.

The dielectric capping layer 122 is disposed along an upper surface of each dielectric structure 115 such that the dielectric capping layer 122 is laterally offset from an upper surface 114us of the plurality of conductive wires 114. The etch stop layer 124 overlies the conductive wires 114 and the dielectric capping layer 122. Further, the second ILD layer 126 overlies the etch stop layer 124. The upper conductive via 128 is disposed within the second ILD layer 126 and overlies an underlying conductive wire 114. The upper conductive wire 130 is disposed within the second ILD layer 126 and overlies the upper conductive via 128. In some embodiments, the etch stop layer 124 may, for example, be or comprise silicon nitride, silicon carbide, silicon oxynitride, silicon oxycarbide, another dielectric material, or any combination of the foregoing. In some embodiments, the second ILD layer 126 may, for example, be or comprise a low-k dielectric material (e.g., a dielectric material with a dielectric constant less than 3.9), an extreme low-k dielectric material, another dielectric material, or any combination of the foregoing. In further embodiments, the upper conductive via and wire 128, 130 may, for example, respectively be or comprise copper, aluminum, ruthenium, tungsten, another conductive material, or any combination of the foregoing. In yet further embodiments, the dielectric capping layer 122 may, for example, be or comprise an oxide, a nitride, and/or a carbide of aluminum, zirconium, yttrium, hafnium, titanium, and/or another material, or any combination of the foregoing. For example, the dielectric capping layer 122 may comprise aluminum oxide, aluminum nitride, aluminum carbide, zirconium oxide, zirconium nitride, zirconium carbide, yttrium oxide, yttrium nitride, yttrium carbide, hafnium oxide, hafnium nitride, hafnium carbide, titanium oxide, titanium nitride, titanium carbide, another material, or any combination of the foregoing. In yet further embodiments, the dielectric capping layer 122 may have a thickness within a range of about 2 to 200 Angstroms or another suitable thickness value. In some embodiments, a dielectric constant of the dielectric capping layer 122 is greater than a dielectric constant of the dielectric structure 115.

In some embodiments, during fabrication of the upper conductive via and wire 128, 130, an etching process is performed into the second ILD layer 126 and the etch stop layer 124 to form a conductive feature opening for the upper conductive via and wire 128, 130. The etching process may expose the upper surface 114us of an underlying conductive wire 114. Due to an overlay mismatch between the underlying conductive wire 114 and a photomask (not shown) utilized to perform the etching process, the etching process may also expose an upper surface of the dielectric capping layer 122. This overlay mismatch may be due to limitations of light diffraction of photolithography, limitations of mask alignment, and/or limitations of photolithography tools. Further, as a distance d1 between adjacent conductive wires 114 becomes relatively small (e.g., less than about 12 nanometers), a number of conductive features in the interconnect structure 107 may be increased, however, the limitations causing the overlay mismatch may also be increased. However, the dielectric capping layer 122 is configured to protect the dielectric structure 115 during the etching process, thereby mitigating issues related to the overlay mismatch and preventing over-etching into the layers of the dielectric structure 115. This, in part, is because the dielectric capping layer 122 is etched more slowly than the etch stop layer 124 and the second ILD layer 126 during the etching process.

Thus, damage to the dielectric structure 115 may be mitigated during the etching process, thereby mitigating time dependent dielectric breakdown (TDDB) of the interconnect dielectric structure and mitigating current leakage paths between the adjacent conductive wires 114. This increases an endurance and reliability of the integrated chip 200a.

In further embodiments, the second dielectric liner 118 may be porous such that an effective dielectric constant of the second dielectric liner 118 is reduced. In some embodiments, porosity is void space that is distributed throughout the dielectric material of the second dielectric liner 118, whereas air-gaps are larger voids in a dielectric structure that would otherwise be filled by dielectric material. In yet further embodiments, a porosity of the second dielectric liner 118 may be within a range of about 0.1% to 10% or another suitable value. In some embodiments, the second dielectric liner 118 has a dielectric constant that, for example, is within a range of about 2.0 to 4.0, less than about 4.0, or another suitable value. This, in part, may further decrease a capacitance between adjacent conductive wires 114, thereby increasing a performance of the integrated chip 200a.

In some embodiments, the upper conductive via 128 directly contacts the underlying conductive wire 114, such that a diffusion barrier layer (not shown) and/or an upper adhesion layer (not shown) are not disposed between the upper conductive via 128 and the underlying conductive wire 114. This, in part, may reduce a resistance between the upper conductive via 128 and the conductive wires 114, thereby increasing a performance of the interconnect structure 107. The resistance is reduced because the diffusion barrier layer and/or the upper adhesion layer may comprise a first conductive material (e.g., titanium nitride, tantalum nitride, or the like) and the upper conductive via 128 may comprise a second conductive material (e.g., aluminum, copper, ruthenium, or the like), where the first conductive material has greater resistivity than the second conductive material.

Figure 2B:
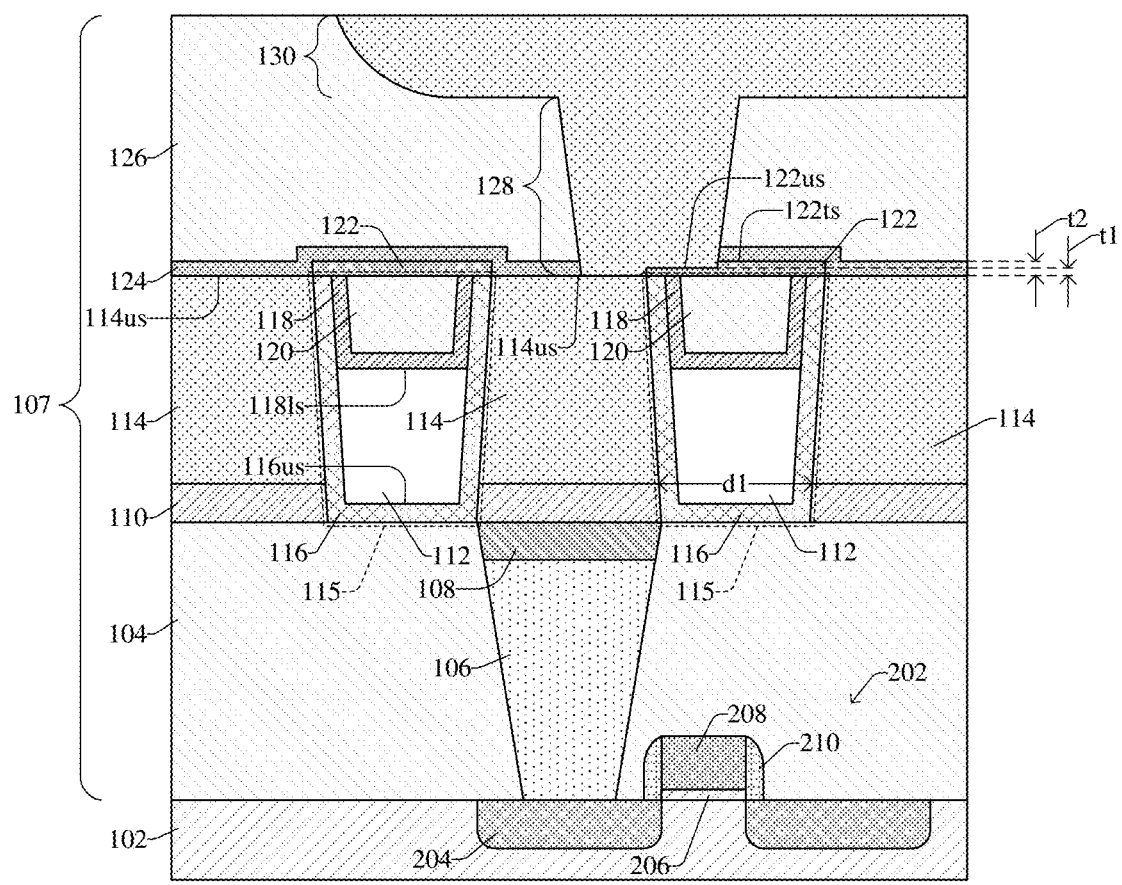

FIG. 2B illustrates a cross-sectional view of some embodiments of an integrated chip 200b according to some alternative embodiments of the integrated chip 200a of FIG. 2A, wherein an upper surface 122us of the dielectric capping layer 122 is vertically below a top surface 122ts of the dielectric capping layer 122. In some embodiments, an etching process (e.g., see FIG. 18) utilized to form the upper conductive via 128 over-etches the dielectric capping layer 122 such that a first thickness t1 of the dielectric capping layer 122 is less than a second thickness t2 of the dielectric capping layer 122. The first thickness t1 is defined from a bottom surface of the dielectric capping layer 122 to the upper surface 122us of the dielectric capping layer 122 and the second thickness t2 is defined from the bottom surface of the dielectric capping layer 122 to the top surface 122ts of the dielectric capping layer 122.

Figure 3:
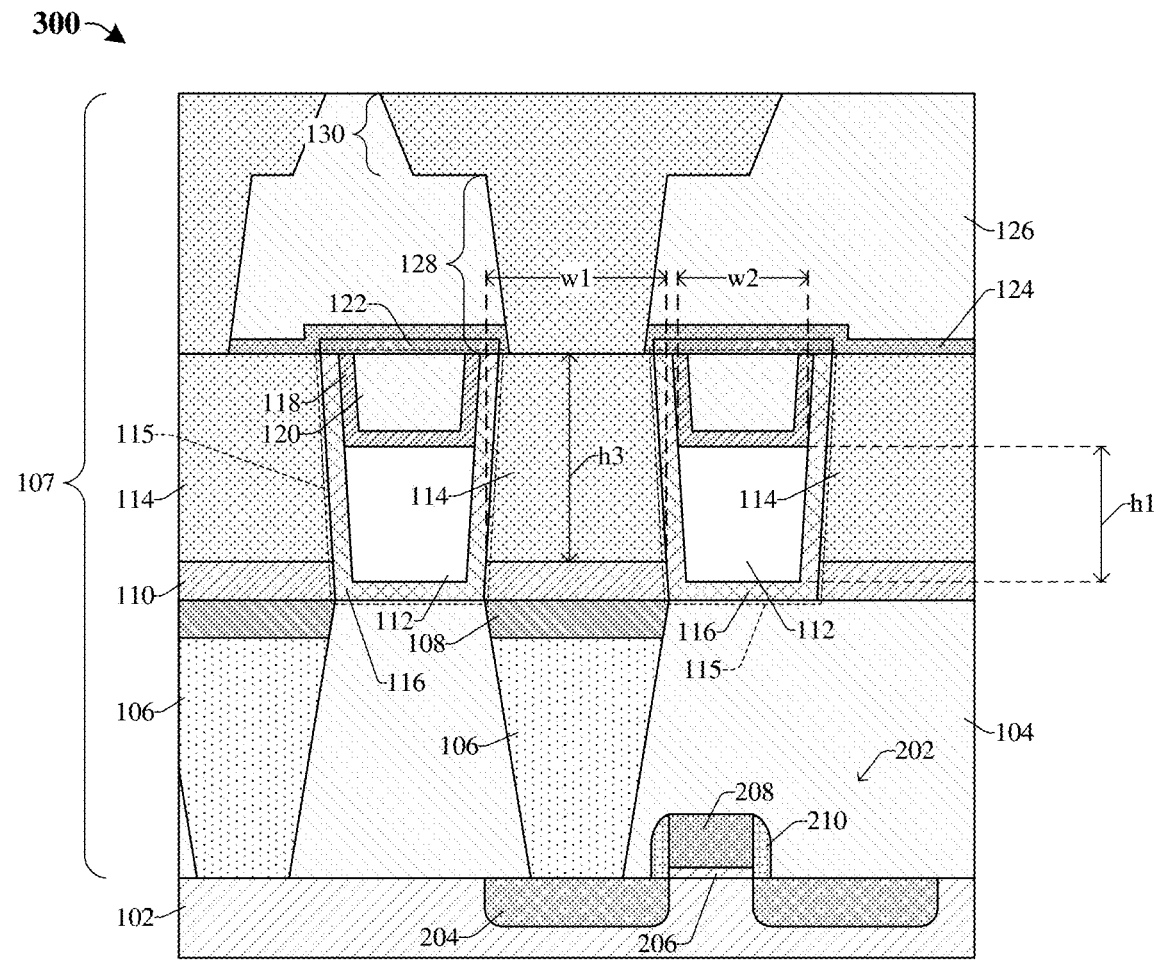

FIG. 3 illustrates a cross-sectional view of some embodiments of an integrated chip 300 according to alternative embodiments of the integrated chip 100 of FIG. 1.

In some embodiments, the interconnect structure 107 includes a plurality of conductive contacts 106, a plurality of conductive wires 114, a plurality of upper conductive vias 128, and a plurality of upper conductive wires 130. In some embodiments, an upper conductive via 128 may directly overlie an underlying conductive wire 114 such that the upper conductive via 128 is spaced laterally between opposing sidewalls of the underlying conductive wire 114. In such embodiments, the upper conductive via 128 may not contact the dielectric capping layer 122 and is spaced laterally between sidewalls of the dielectric capping layer 122.

In some embodiments, a ratio of a first width w1 of a conductive wire 114 to a second width w2 of an air-gap 112 is within a range of about 0.1 to 10 or another suitable value. Thus, in some embodiments, the second width w2 is at least 10 times greater than the first width w1. In further embodiments, the first width w1 is about 10 times greater than the second width w2. In yet further embodiments, a ratio of a third height h3 of the conductive wire 114 to the first height h1 of the air-gap 112 is within a range of about 1.1 to 10 or another suitable value. Thus, in some embodiments, the third height h3 is greater than the first height h1. It will be appreciated that the aforementioned ratios described with reference to the integrated chip 300 of FIG. 3 are also applicable to the integrated chips 100, 200a, and 200b of FIGS. 1, 2A, and 2B, respectively.

FIGS. 4-20 illustrate cross-sectional views 400-2000 of some embodiments of a method of forming an integrated chip having a dielectric capping layer overlying a dielectric structure that is disposed between adjacent conductive wires. Although the cross-sectional views 400-2000 shown in FIGS. 4-20 are described with reference to a method, it will be appreciated that the structures shown in FIGS. 4-20 are not limited to the method but rather may stand alone separate of the method. Furthermore, although FIGS. 4-20 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 4:
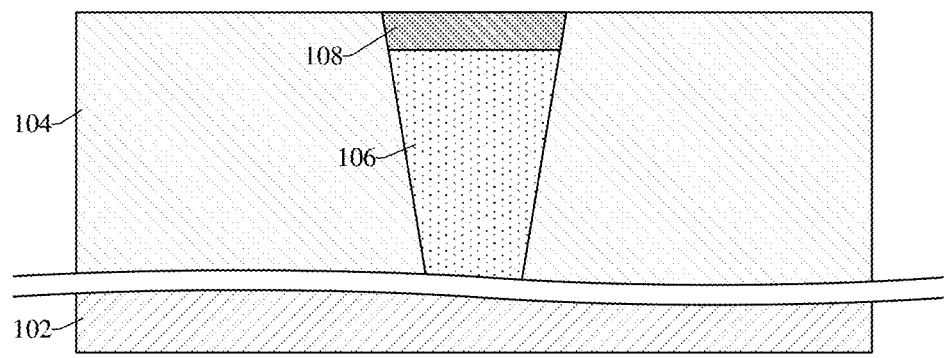
FIGS. 4-20 illustrate cross-sectional views of some embodiments of a method of forming an integrated chip having a dielectric capping layer overlying a dielectric structure that is disposed between adjacent conductive wires.

As shown in cross-sectional view 400 of FIG. 4, a conductive contact 106 is formed over a substrate 102 and within a first inter-level dielectric (ILD) layer 104. In some embodiments, the substrate 102 may, for example, be or comprise a bulk substrate (e.g., a bulk silicon substrate), a silicon-on-insulator (SOI) substrate, or another suitable material. In some embodiments, the conductive contact 106 may, for example, be or comprise copper, cobalt, ruthenium, molybdenum, chromium, tungsten, manganese, rhodium, nickel, palladium, platinum, silver, gold, aluminum, another conductive material, or any combination of the foregoing and/or may be formed to a thickness within a range of about 50 to 500 or another suitable thickness value. Further, the conductive contact 106 may be formed by a dual damascene process or a single damascene process. In some embodiments, the conductive contact 106 may be disposed within a first metallization layer formed in an interconnect structure overlying the substrate 102. In further embodiments, the conductive contact 106 may directly overlie, be directly electrically coupled to, and/or directly contact doped regions disposed within the substrate 102 and/or a semiconductor device (not shown) (e.g., a transistor) disposed within/other the substrate 102 (e.g., see FIG. 2A).

In some embodiments, a single damascene process for forming the conductive contact 106 may include: depositing (e.g., by chemical vapor deposition (CVD), physical vapor deposition (PVD), atomic layer deposition (ALD), etc.) the first ILD layer 104 over the substrate 102; patterning the first ILD layer 104 to define a lower conductive feature opening within the first ILD layer 104; depositing (e.g., by PVD, CVD, ALD, etc.) a conductive material over the substrate 102, thereby filling the lower conductive feature opening; and performing a planarization process (e.g., a chemical mechanical planarization (CMP) process) into the conductive material, thereby defining the conductive contact 106.

Further, as illustrated in cross-sectional view 400 of FIG. 4, a conductive capping layer 108 is formed along an upper surface of the conductive contact 106. In some embodiments, the conductive capping layer 108 may, for example, be deposited by CVD, PVD, ALD, or another suitable growth or deposition process. In some embodiments, the conductive capping layer 108 may, for example, be or comprise copper, cobalt, ruthenium, molybdenum, chromium, tungsten, manganese, rhodium, nickel, palladium, platinum, silver, gold, aluminum, another conductive material, or any combination of the foregoing and/or may be formed to a thickness within a range of about 2 to 50 or another suitable thickness value.

Figure 5:
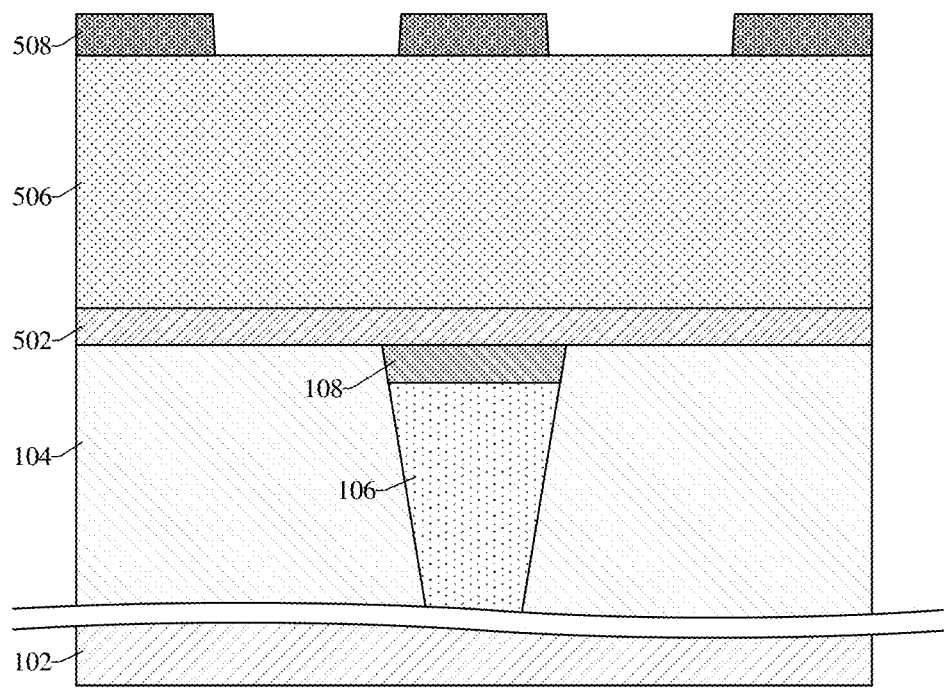

As shown in cross-sectional view 500 of FIG. 5, an adhesion film 502 is deposited over the first ILD layer 104 and the conductive capping layer 108. A conductive layer 506 is deposited over the adhesion film 502 and a masking layer 508 is formed over the conductive layer 506. In some embodiments, forming the masking layer 508 may include depositing a hard mask material over the conductive layer 506 and patterning the hard mask to define the masking layer 508 with a plurality of sidewalls defining a plurality of openings over the conductive layer 506. In some embodiments, the adhesion film 502 and/or the conductive layer 506 may, for example, respectively be deposited by PVD, CVD, ALD, or another suitable growth or deposition process. In some embodiments, the adhesion film 502 may, for example, be or comprise tantalum, titanium, tantalum nitride, titanium nitride, another conductive material, or any combination of the foregoing and/or may be formed to a thickness within a range of about 2 to 100 angstroms or another suitable thickness value. In further embodiments, the conductive layer 506 may, for example, be or comprise copper, cobalt, ruthenium, molybdenum, chromium, tungsten, manganese, rhodium, nickel, palladium, platinum, silver, gold, aluminum, another conductive material, or any combination of the foregoing.

Figure 6:
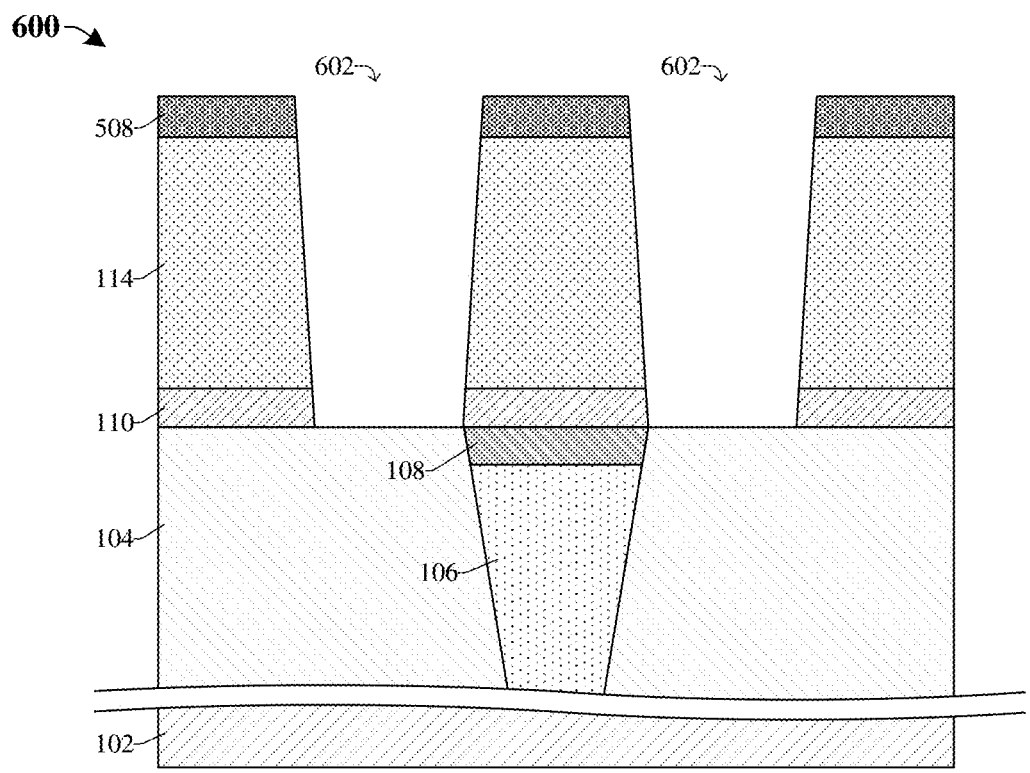

As shown in cross-sectional view 600 of FIG. 6, an etching process is performed on the adhesion film (502 of FIG. 5) and the conductive layer (506 of FIG. 5) according to the masking layer 508, thereby forming a plurality of conductive wires 114 and an adhesion layer 110. Further, the etching process forms a plurality of openings 602 disposed laterally between adjacent conductive wires 114. In some embodiments, the etching process includes performing a dry etch process, a reactive-ion etching (RIE) process, another etch process, or any combination of the foregoing.

Figure 7:
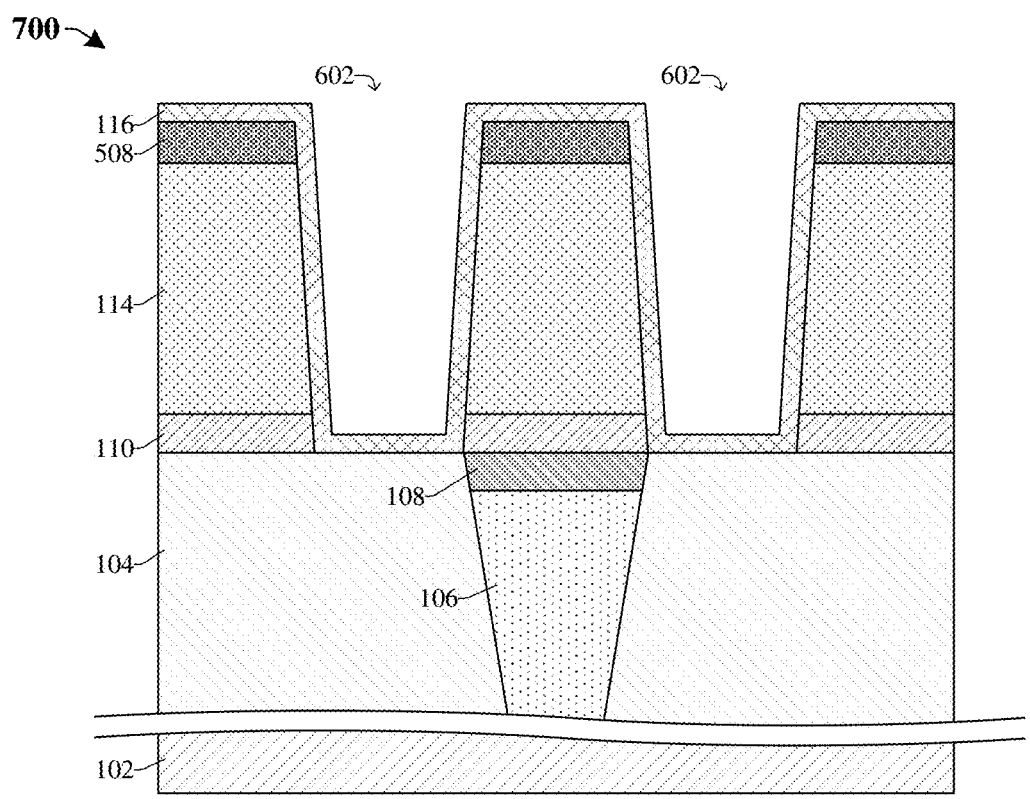

As shown in cross-sectional view 700 of FIG. 7, a first dielectric liner 116 is deposited over the masking layer 508 and the first ILD layer 104, such that the first dielectric liner 116 lines the plurality of openings 602. In some embodiments, the first dielectric liner 116 may, for example, be deposited by PVD, CVD, ALD, plasma enhanced CVD (PECVD), plasma enhanced ALD (PEALD), or another suitable growth or deposition process. In some embodiments, the first dielectric liner 116 may, for example, be or comprise silicon dioxide, silicon oxycarbide, silicon oxynitride, silicon carbon nitride, silicon carbon oxynitride, aluminum nitride, aluminum oxynitride, aluminum oxide (e.g., $Al_2O_3$), another dielectric material, or any combination of the foregoing and/or may be formed to a thickness within a range of about 2 to 50 Angstroms or another suitable thickness value.

Figure 8:
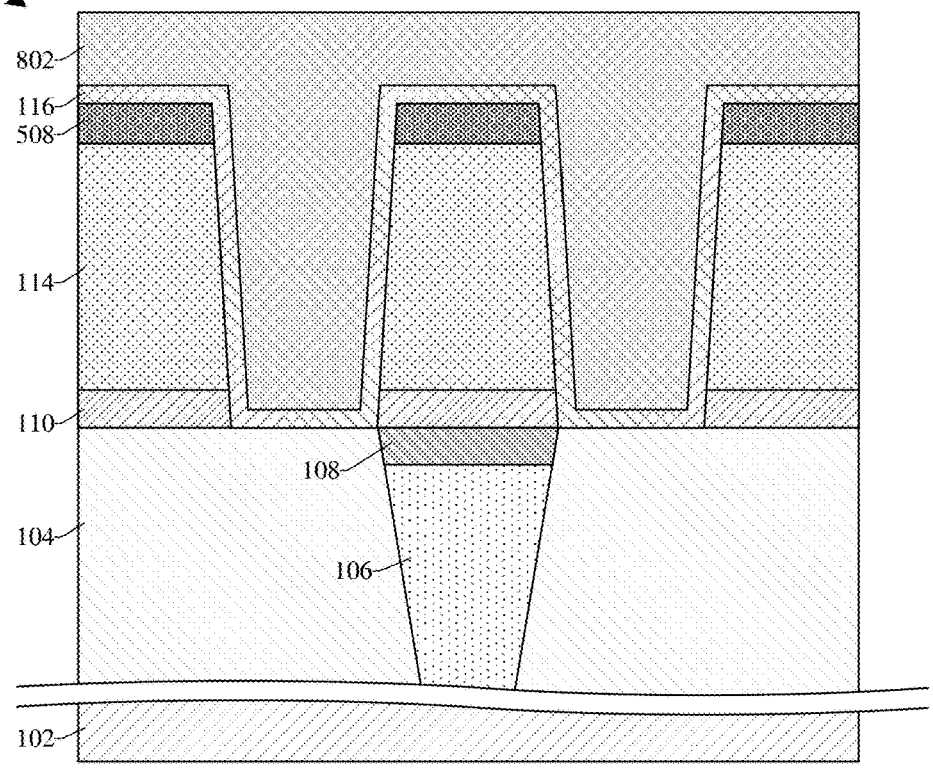

As shown in cross-sectional view 800 of FIG. 8, a sacrificial layer 802 is deposited over the first dielectric liner 116, thereby filling the openings (602 of FIG. 7). In some embodiments, the sacrificial layer 802 may be deposited by CVD, ALD, molecular layer deposition (MLD), spin coating, or another suitable deposition or growth process. In further embodiments, the sacrificial layer 802 may, for example, be or comprise an organic layer containing carbon, oxygen, hydrogen, nitrogen, another element, or any combination of the foregoing.

Figure 9:
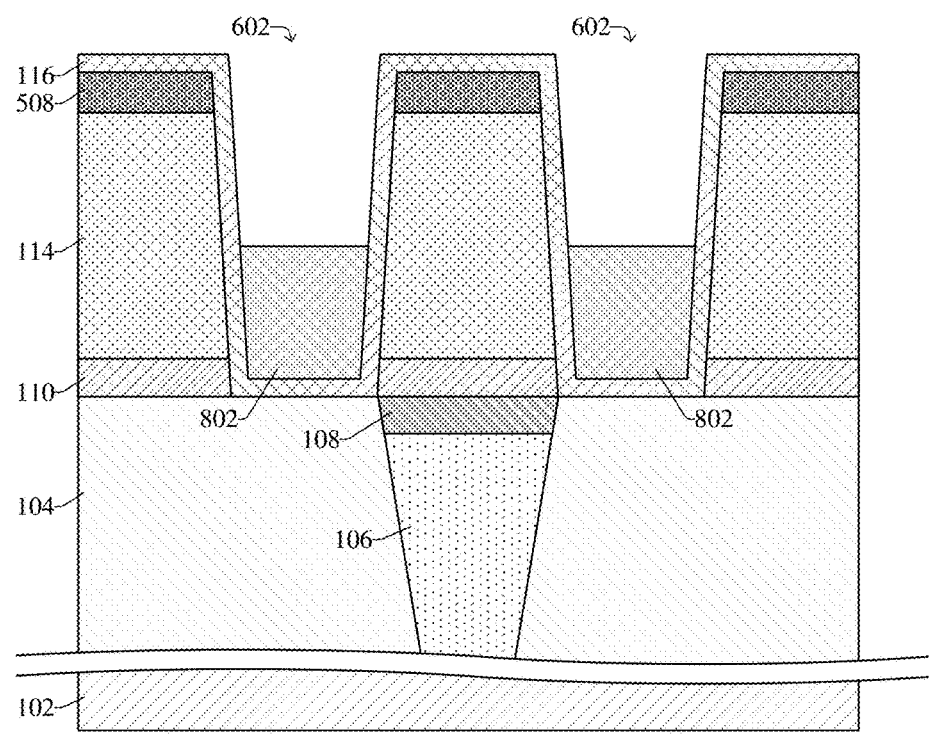

As shown in cross-sectional view 900 of FIG. 9, a thinning process is performed on the sacrificial layer 802 to decrease a thickness of the sacrificial layer 802 and reopen the plurality of openings 602. In some embodiments, the thinning process includes performing an annealing process, an etch back process, another suitable thinning process, or any combination of the foregoing. In some embodiments, in which the removal process includes performing an etch back process, the sacrificial layer 802 is etched more quickly than the first dielectric liner 116. Further, the thinning process is performed in such a manner that a thickness of the sacrificial layer 802 is within a range of about 10 to 100 Angstroms or another suitable thickness value.

Figure 10:
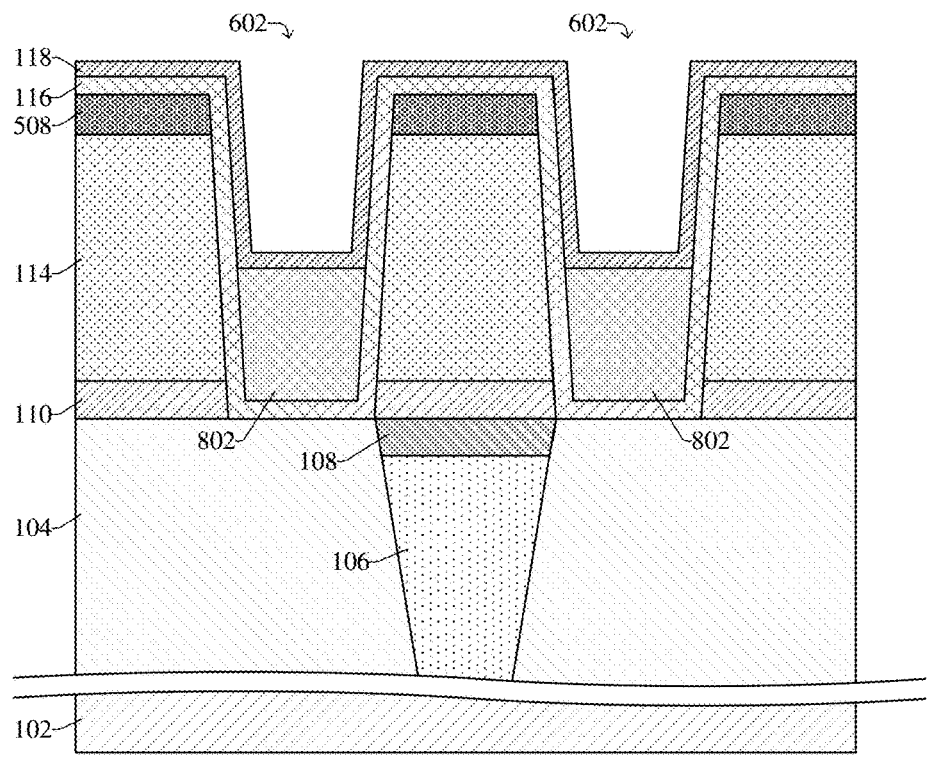

As shown in cross-sectional view 1000 of FIG. 10, a second dielectric liner 118 is deposited over the sacrificial layer 802 and the first dielectric liner 116, thereby lining the openings 602. In some embodiments, the second dielectric liner 118 may be deposited by, for example, PVD, CVD, ALD, PECVD, PEALD, or another suitable growth or formation process. In further embodiments, the second dielectric liner 118 may, for example, be or comprise silicon dioxide, silicon oxycarbide, silicon oxynitride, silicon carbon nitride, silicon carbon oxynitride, another dielectric material, or any combination of the foregoing and/or may be formed with a thickness within a range of about 2 to 100 Angstroms or another suitable thickness value. In yet further embodiments, the second dielectric liner 118 may be formed with a porosity within a range of about 0.1% to 10% or another suitable value.

Figure 11:
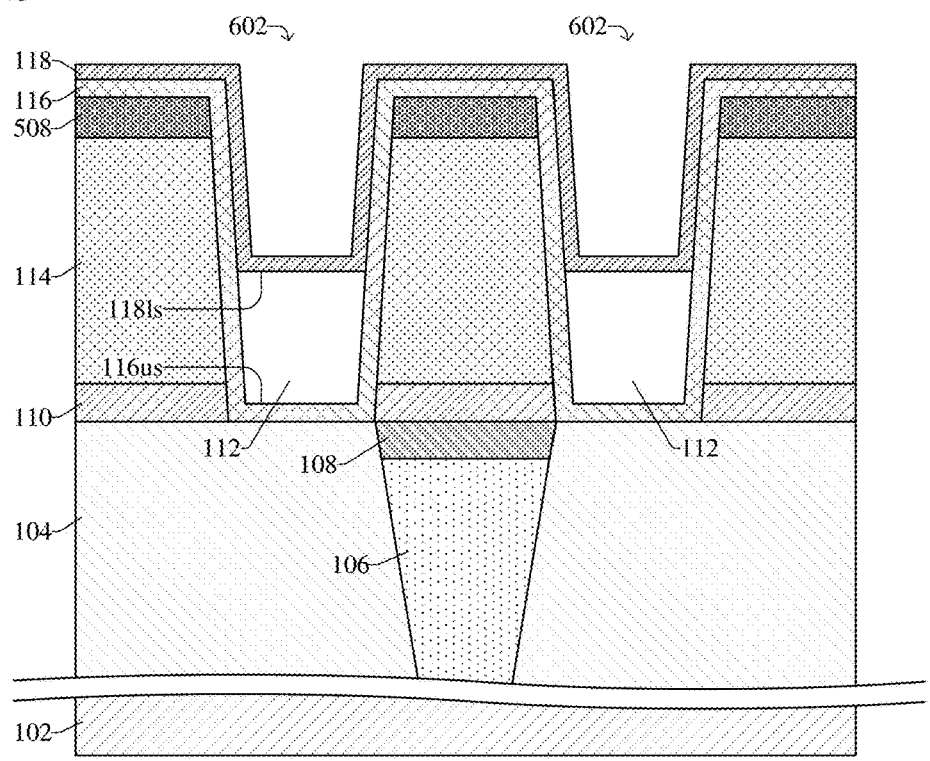

As shown in cross-sectional view 1100 of FIG. 11, a removal process is performed on the structure of FIG. 10 to form a plurality of air-gaps 112 between an upper surface 116us of the first dielectric liner 116 and a lower surface 118ls of the second dielectric liner 118. In some embodiments, the plurality of air-gaps 112 is formed in place of the sacrificial layer (802 of FIG. 10). In some embodiments, the removal process may include performing a thermal baking process, an ultraviolent (UV) curing process, another suitable removal process, or any combination of the foregoing. The removal process is configured to remove the sacrificial layer (802 of FIG. 10) while leaving the other layers overlying the substrate 102 in place.

In some embodiments, because the second dielectric liner 118 is porous (e.g., has a porosity within a range of about 0.1% to 10%), the sacrificial layer (802 of FIG. 10) may evaporate through the second dielectric liner 118 during the removal process, thereby forming the plurality of air-gaps 112. Thus, in such embodiments, the second dielectric liner 118 may act as a permeable layer during the removal process such that the sacrificial layer (802 of FIG. 10) may be decomposed during the removal process and then be subsequently removed (e.g., evaporate) through the second dielectric liner 118.

Figure 12:
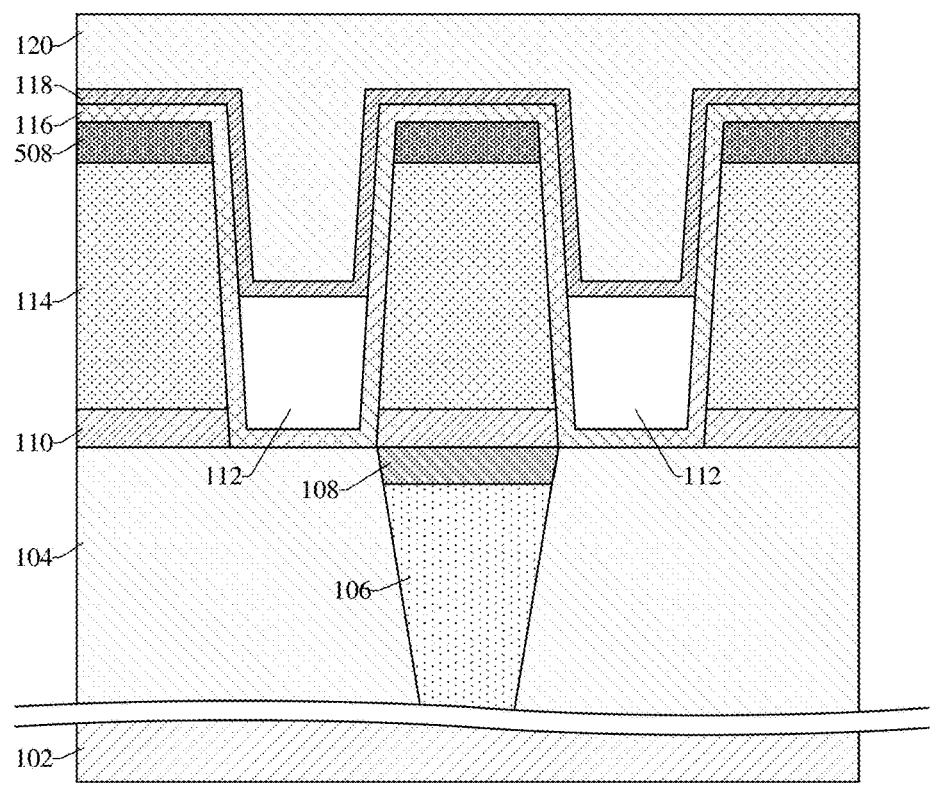

As shown in cross-sectional view 1200 of FIG. 12, a dielectric layer 120 is deposited over the second dielectric liner 118 such that the dielectric layer 120 fills the openings (602 of FIG. 11). In some embodiments, the dielectric layer 120 may, for example, be formed by CVD, ALD, a spin coating, or another suitable deposition or growth process. In further embodiments, the dielectric layer 120 may, for example, be or comprise hydrogen-containing silicon oxycarbide (SiCOH), a low-k dielectric material, an extreme low-k dielectric material, another dielectric material, or any combination of the foregoing.

Figure 13:
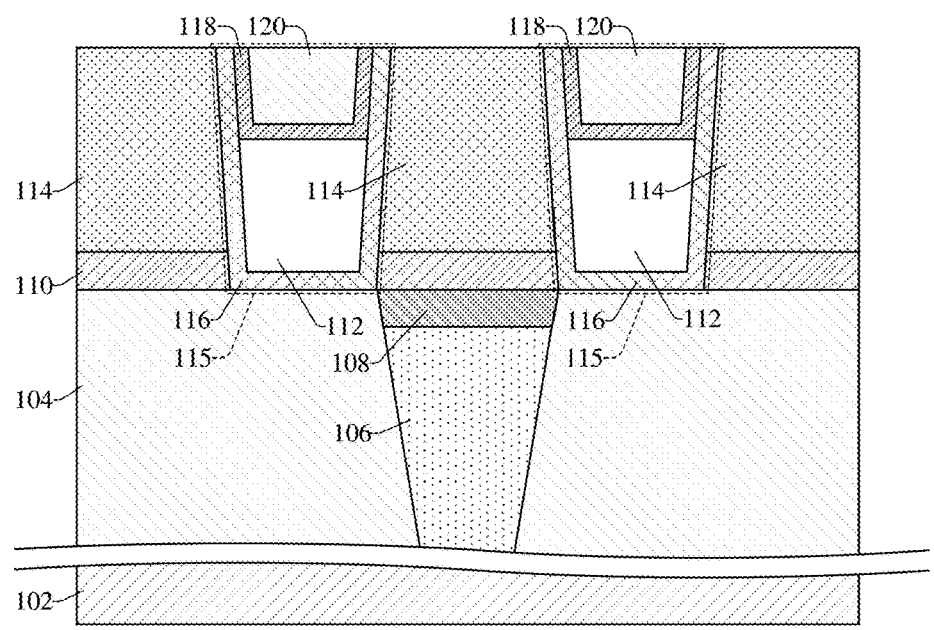

As shown in cross-sectional view 1300 of FIG. 13, a planarization process (e.g., a CMP process) is performed into the structure of FIG. 13, thereby forming a plurality of dielectric structure 115 between adjacent conductive wires 114. In some embodiments, each dielectric structure 115 includes the first dielectric liner 116, the second dielectric liner 118, the dielectric layer 120, and the air-gap 112. In some embodiments, by virtue of the air-gap 112 and a material of the dielectric layers within the dielectric structure 115, an effective dielectric constant of the dielectric structure 115 is within a range of about 1 to 2, less than 2, within a range of about 1.5 to 2.5, or another suitable dielectric constant value. By virtue of the relatively low effective dielectric constant (e.g., less than about 2) of the dielectric structure 115, a capacitance between the adjacent conductive wires 114 is decreased, thereby increasing a performance of the conductive wires 114 and the conductive contact 106. In some embodiments, after performing the planarization process, a thickness of the dielectric layer 120 is within a range of about 10 to 700 Angstroms or another suitable thickness value and/or a thickness of the plurality of conductive wires 114 is within a range of about 50 to 500 Angstroms or another suitable thickness value.

Figure 14:
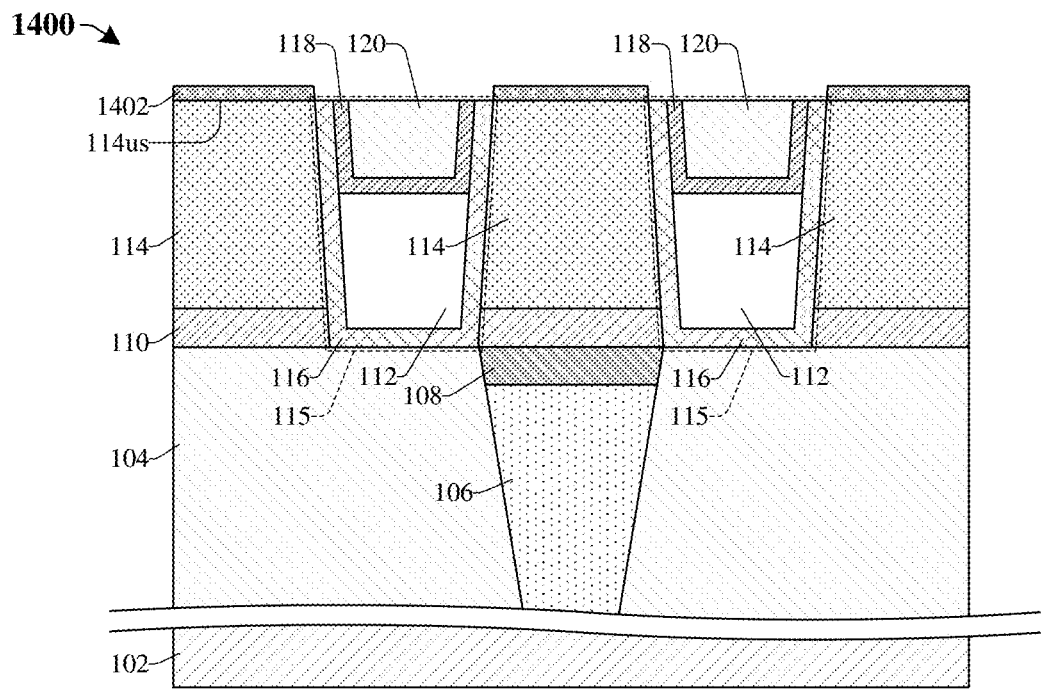

As shown in cross-sectional view 1400 of FIG. 14, an inhibitor layer 1402 is selectively deposited over an upper surface 114us of the plurality of conductive wires 114. In some embodiments, the inhibitor layer 1402 may be referred to as a blocking layer, a self-assembled monolayer (SAM), or the like. In further embodiments, the inhibitor layer 1402 comprises a head group (not shown) that adheres or bonds to the conductive wires 114 but not to the dielectric structure 115. In some embodiments, the inhibitor layer 1402 may be deposited by spin coating. In further embodiments, a process for forming the inhibitor layer 1402 includes spinning the inhibitor layer 1402 onto the structure of FIG. 13, upon being spun onto the structure of FIG. 13 the inhibitor layer 1402 will adhere to the upper surface 114us of the conductive wires 114 but not to the plurality of dielectric structures 115. Thus, the inhibitor layer 1402 is laterally offset from an upper surface of the plurality of dielectric structures 115. In yet further embodiments, the inhibitor layer 1402 may be formed by CVD, spin on, a dipping process, or another suitable deposition or growth process. In some embodiments, the inhibitor layer 1402 may, for example, be or comprise benzotriazole, benzotriazole derivatives, another suitable material, or any combination of the foregoing.

In some embodiments, the inhibitor layer 1402 is formed over the conductive wires 114 in such a manner that the inhibitor layer 1402 comprises a head group (i.e., anchor) connected to a terminal group (i.e., function group) by way of a molecular chain (i.e., tail) (not shown). The head group is configured to adhere to preferred surfaces such as the upper surface 114us of the conductive wires 114 while not adhering to other surfaces such as the upper surface of the plurality of dielectric structures 115. Thus, in some embodiments, the head group is disposed along the upper surface 114us of the conductive wires 114 and the terminal group is vertically above the head group. In some embodiments, the head group may, for example, be or comprise sulfhydryl, a nitride, a phosphide, a sulfide, silicon, another suitable material, or any combination of the foregoing, which provide the preference of adhering to the conductive wires 114. In further embodiments, the molecular chain may, for example, be or comprise an alkyl chain, such as methylene $(CH_2)n$, another material, or any combination of the foregoing. The terminal group is configured to repel a dielectric material, thereby preventing dielectric material from adhering to the inhibitor layer 1402. In some embodiments, the terminal group may, for example, be or comprise a methyl group $(CH_3)$, another material, or any combination of the foregoing.

Figure 15:
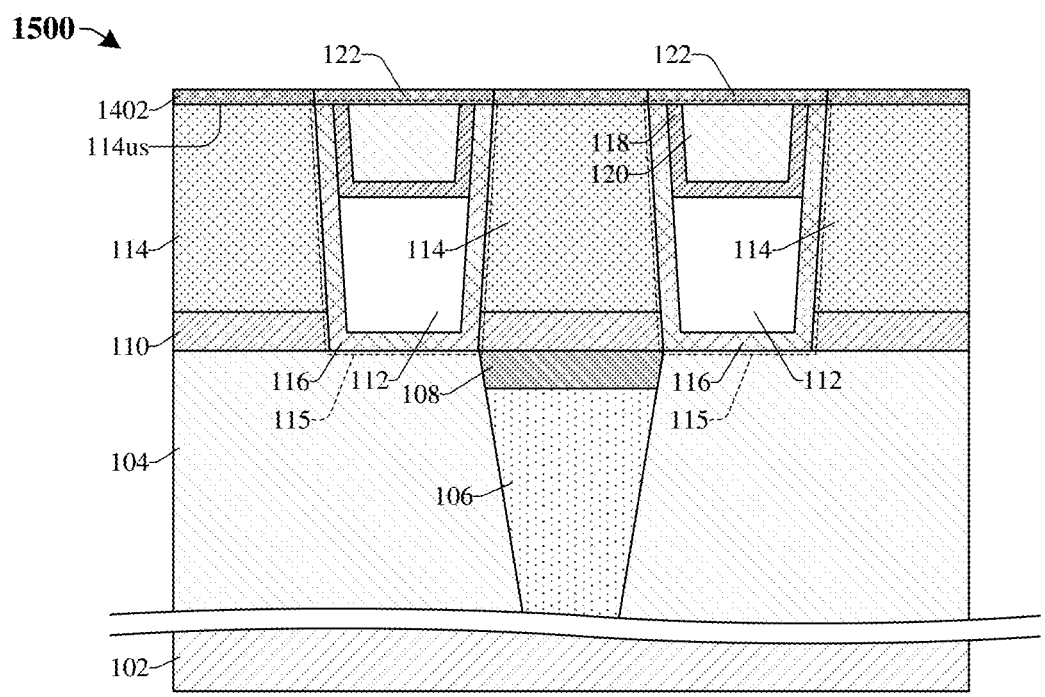

As shown in cross-sectional view 1500 of FIG. 15, a dielectric capping layer 122 is selectively deposited over the upper surface of the plurality of dielectric structures 115. In some embodiments, the dielectric capping layer 122 may be deposited by, for example, CVD, PVD, ALD, spin-on, electroless plating, or another suitable growth or deposition process. The dielectric capping layer 122 is selectively deposited such that it is disposed along the upper surface of the plurality of dielectric structures 115 and is laterally offset from the upper surface 114us of the conductive wires 114. This, in part, is because the terminal group of the inhibitor layer 1402 is configured to prevent deposition of the dielectric capping layer 122 over the inhibitor layer 1402. Thus, in some embodiments, the inhibitor layer 1402 is configured to prevent and/or block deposition of the dielectric capping layer 122 on the upper surface of the inhibitor layer 1402 such that the dielectric capping layer 122 may be selectively deposited in areas in which the inhibitor layer 1402 is not located.

In yet further embodiments, the dielectric capping layer 122 may, for example, be or comprise an oxide, a nitride, and/or a carbide of aluminum, zirconium, yttrium, hafnium, titanium, and/or another material, or any combination of the foregoing. For example, the dielectric capping layer 122 may comprise aluminum oxide, aluminum nitride, aluminum carbide, zirconium oxide, zirconium nitride, zirconium carbide, yttrium oxide, yttrium nitride, yttrium carbide, hafnium oxide, hafnium nitride, hafnium carbide, titanium oxide, titanium nitride, titanium carbide, another material, or any combination of the foregoing. In yet further embodiments, the dielectric capping layer 122 may be formed to a thickness within a range of about 2 to 200 Angstroms or another suitable thickness value.

Figure 16:
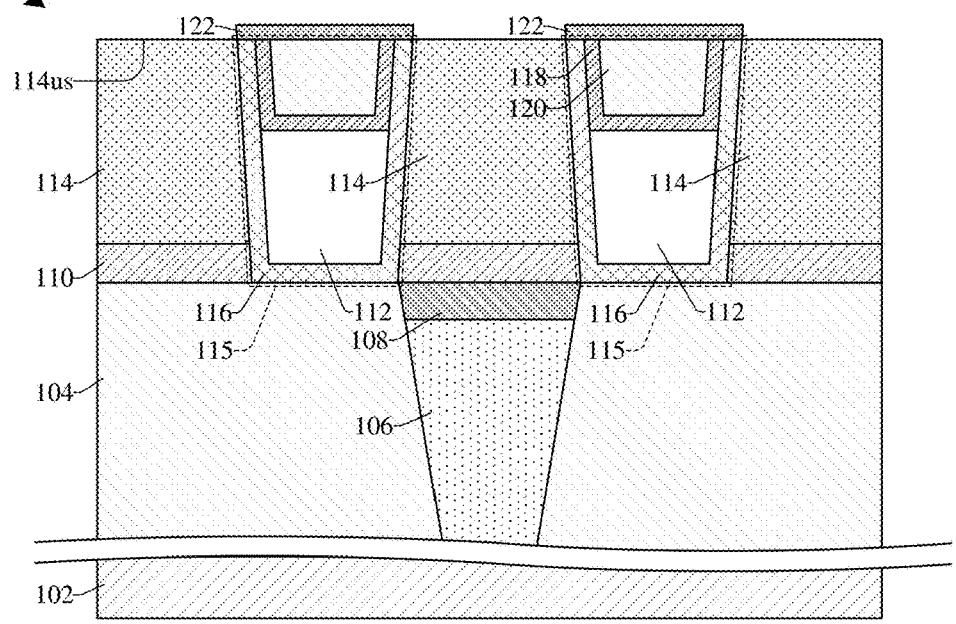

As shown in cross-sectional view 1600 of FIG. 16, a removal process is performed to remove the inhibitor layer (1402 of FIG. 15) from the upper surface 114us of the conductive wires 114. In some embodiments, the removal process includes performing an annealing process, a wet etch process, a dry etch process, another suitable removal process, or any combination of the foregoing. For example, in further embodiments, the removal process includes exposing the structure of FIG. 15 to a removal plasma (e.g., hydrogen $(H_2)$) that is configured to remove the inhibitor layer (1402 of FIG. 15).

Figure 17:
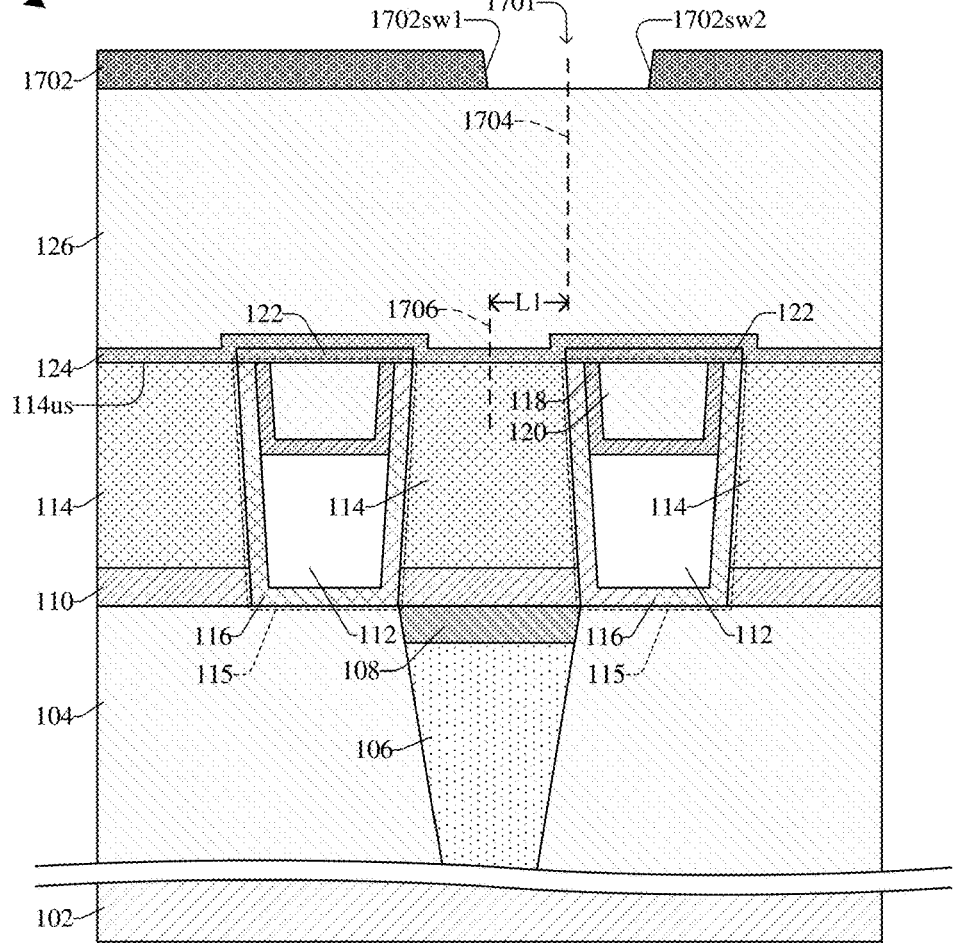

As shown in cross-sectional view 1700 of FIG. 17, an etch stop layer 124 is deposited over the plurality of conductive wires 114 and the dielectric capping layer 122. In some embodiments, the etch stop layer 124 may, for example, be deposited by CVD, PVD, ALD, or another suitable growth or deposition process. Further, a second ILD layer 126 is deposited over the etch stop layer 124. In some embodiments, the second ILD layer 126 may, for example, be deposited by CVD, PVD, ALD, or another suitable growth or deposition process. Subsequently, a masking layer 1702 is formed over the second ILD layer 126. In further embodiments, a process for forming the masking layer 1702 includes depositing a masking layer material over the second ILD layer 126, and subsequently patterning the masking layer material according to a photomask (not shown) to define opposing sidewalls 1702sw1, 1702sw2. The opposing sidewalls 1702sw1, 1702sw2 define an opening 1701 directly overlying an underlying conductive wire 114.

In some embodiments, a center of the opening 1701 is aligned with a first substantially straight line 1704 and a center of the underlying conductive wire 114 is aligned with a second substantially straight line 1706. Due to an overlay mismatch between the underlying conductive wire 114 and the photomask used to form the masking layer 1702, the center of the opening 1701 is laterally offset the center of the underlying conductive wire 114 by a first lateral distance L1. In some embodiments, the first lateral distance L1 is non-zero. This overlay mismatch may be due to limitations of light diffraction of photolithography and/or limitations of photolithography tools used to form the masking layer 1702.

In some embodiments, the etch stop layer 124 may, for example, be or comprise silicon nitride, silicon carbide, silicon oxynitride, silicon oxycarbide, another dielectric material, or any combination of the foregoing. In further embodiments, the second ILD layer 126 may, for example, be or comprise a low-k dielectric material (e.g., a dielectric material with a dielectric constant less than 3.9), an extreme low-k dielectric material, another dielectric material, or any combination of the foregoing.

Figure 18:
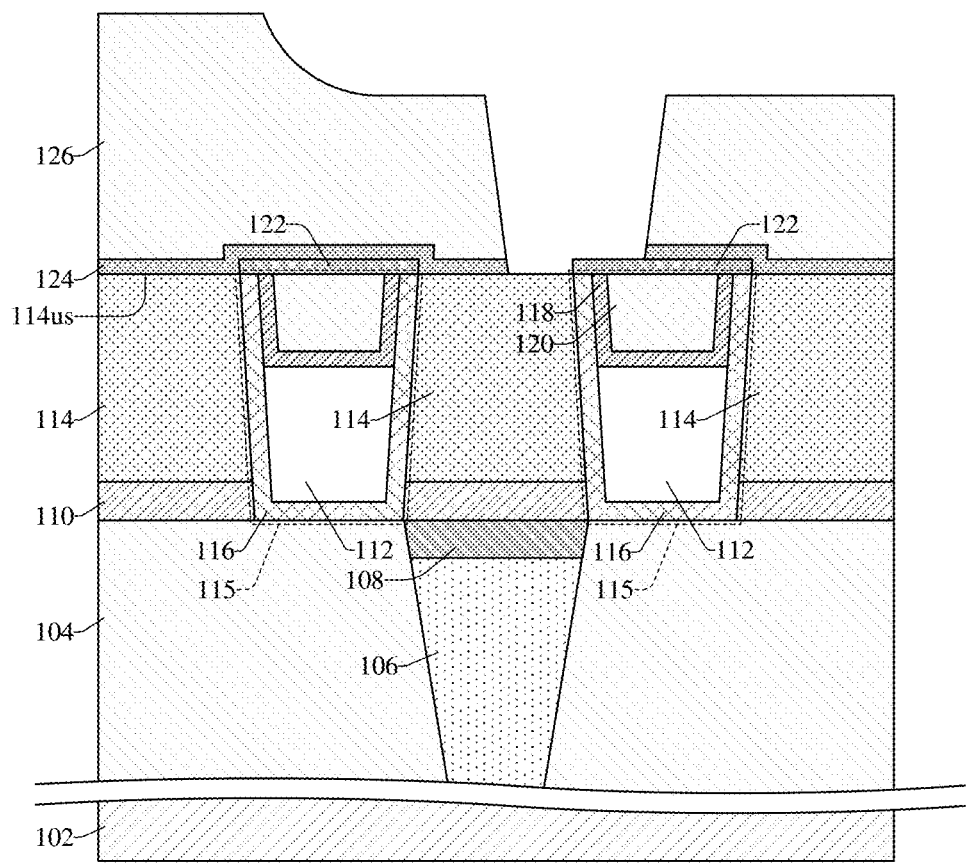

As shown in cross-sectional view 1800 of FIG. 18, an etching process is performed on the structure of FIG. 17, thereby forming an opening 1802 over the underlying conductive wire 114. In some embodiments, the etching process includes performing a wet etch process, a dry etch process, another suitable etch process, or any combination of the foregoing. In further embodiments, the etching process is performed according to the masking layer (1702 of FIG. 17), and due to the overlay mismatch described with reference to FIG. 17 the opening 1802 exposes an upper surface of the underlying conductive wire 114 and an upper surface of the dielectric capping layer 122. During the etching process, the dielectric capping layer 122 is etched at a first etching rate, the etch stop layer 124 is etched at a second etching rate, and the second ILD layer 126 is etched at a third etching rate. In some embodiments, due to a material and/or thickness of the dielectric capping layer 122, the first etching rate is less than the second etching rate and the third etching rate. This, in part, ensures that the etching process does not over-etch into the dielectric structure 115, thereby mitigating issues related to the overlay mismatch. Thus, damage to the dielectric structure 115 may be mitigated during the etching process, thereby mitigating time dependent dielectric breakdown (TDDB) of the dielectric layers and structures adjacent to the conductive wires 114 and mitigating current leakage paths between the conductive wires 114. In yet further embodiments, the first etching rate is less than the second etching rate, and the second etching rate is less than the third etching rate. Thus, during the etching process, the second ILD layer 126 is etched more quickly than the etch stop layer 124, and the etch stop layer 124 is etched more quickly than the dielectric capping layer 122.

In some embodiments, the etching process of FIG. 18 may over-etch into the dielectric capping layer 122 such that an upper surface (122us of FIG. 2B) of the dielectric capping layer 122 is vertically below a top surface (122ts of FIG. 2B) of the dielectric capping layer 122. In such embodiments, a first thickness (t1 of FIG. 2B) of the dielectric capping layer 122 is less than a second thickness (t2 of FIG. 2B) of the dielectric capping layer 122 (e.g., see FIG. 2B).

Figure 19:
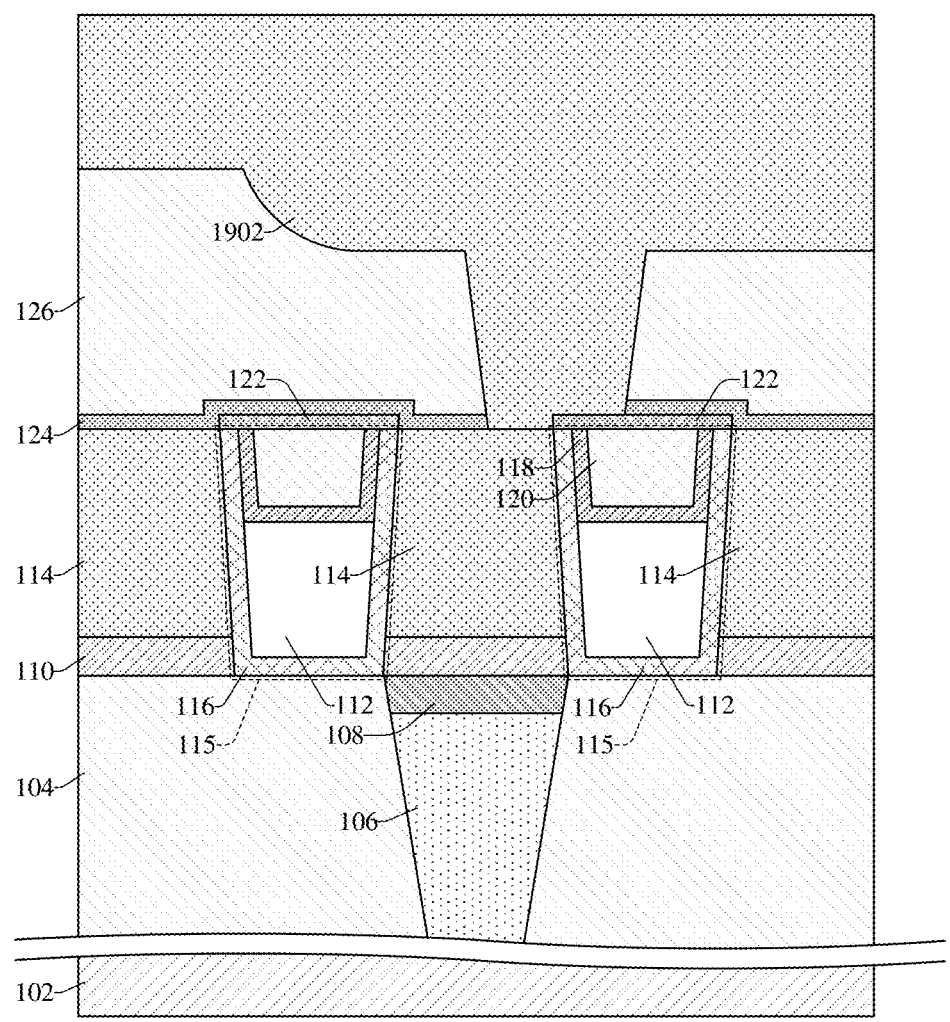

As shown in cross-sectional view 1900 of FIG. 19, a conductive structure 1902 is deposited over the second ILD layer 126, such that the conductive structure 1902 fills the opening (1802 of FIG. 18). In some embodiments, the conductive structure 1902 may, for example, be deposited by CVD, PVD, electroless plating, electro plating, sputtering, or another suitable deposition or growth process. In some embodiments, the conductive structure 1902 may, for example, be or comprise copper, cobalt, ruthenium, molybdenum, chromium, tungsten, manganese, rhodium, nickel, palladium, platinum, silver, gold, aluminum, another conductive material, or any combination of the foregoing. Further, due to the overlay mismatch described with reference to FIG. 17, the conductive structure 1902 continuously extends from an upper surface of the dielectric capping layer 122 to an upper surface of the underlying conductive wire 114.

In some embodiments, the conductive structure 1902 may be formed over the underlying conductive wire 114 without a diffusion barrier layer (not shown) or an adhesion layer (not shown). This, in part, may reduce a resistance between the conductive structure 1902 and the conductive wires 114, thereby increasing a performance of the plurality of conductive wires 114. The resistance is reduced because the diffusion barrier layer and/or adhesion layer may comprise a first conductive material (e.g., titanium nitride, tantalum nitride, or the like) and the conductive structure 1902 may comprise a second conductive material (e.g., aluminum, copper, ruthenium, or the like), where the first conductive material has greater resistivity than the second conductive material.

Figure 20:
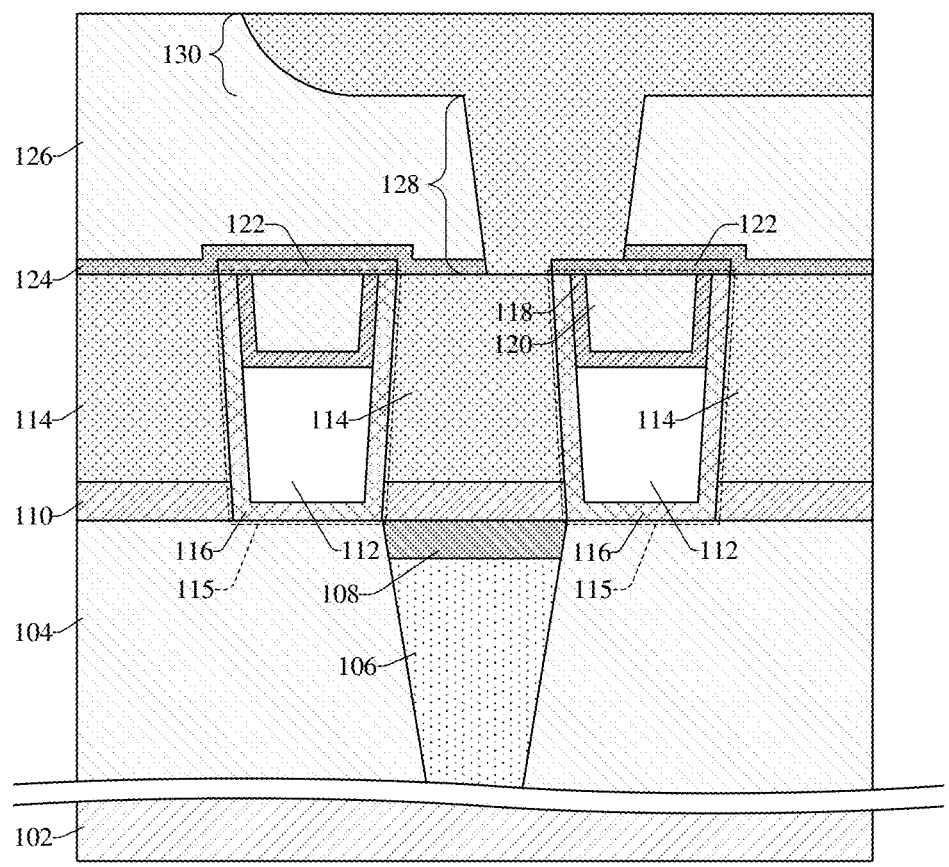

As shown in cross-sectional view 2000 of FIG. 20, a planarization process (e.g., a CMP process) is performed into the conductive structure (1902 of FIG. 19), thereby defining an upper conductive via 128 and an upper conductive wire 130. In some embodiments, the planarization process is performed into the conductive structure (1902 of FIG. 19) until an upper surface of the second ILD layer 126 is reached.

Figure 21:
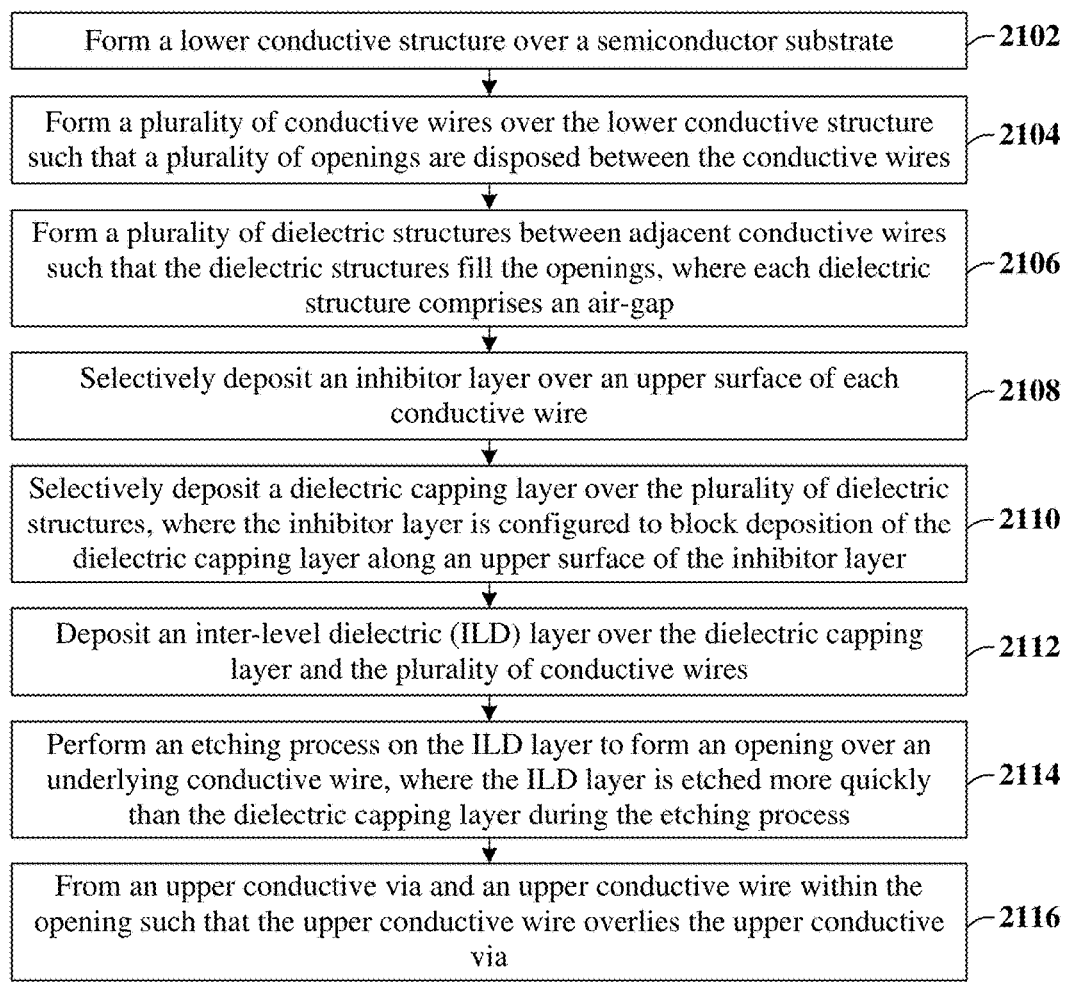
FIG. 21 illustrates a methodology in flowchart format that illustrates some embodiments of a method of forming an integrated chip having a dielectric capping layer overlying a dielectric structure that is disposed between adjacent conductive wires.

FIG. 21 illustrates a method 2100 of forming an integrated chip having a dielectric capping layer overlying a dielectric structure that is disposed between adjacent conductive wires according to the present disclosure. Although the method 2100 is illustrated and/or described as a series of acts or events, it will be appreciated that the method 2100 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2102, a lower conductive structure is formed over a semiconductor substrate. FIG. 4 illustrates a cross-sectional view 400 corresponding to some embodiments of act 2102.

At act 2104, a plurality of conductive wires is formed over the lower conductive structure such that a plurality of openings is disposed between the conductive wires. FIGS. 5 and 6 illustrate cross-sectional views 500 and 600 corresponding to some embodiments of act 2104.

At act 2106, a plurality of dielectric structures is formed between adjacent conductive wires such that the dielectric structures fill the openings. Each dielectric structure comprises and air-gap. FIGS. 7-13 illustrate cross-sectional views 700-1300 corresponding to some embodiments of act 2106.

At act 2108, an inhibitor layer is selectively deposited over an upper surface of each conductive wire. FIG. 14 illustrates a cross-sectional view 1400 corresponding to some embodiments of act 2108.

At act 2110, a dielectric capping layer is selectively deposited over the plurality of dielectric structures, where the inhibitor layer is configured to block deposition of the dielectric capping layer along an upper surface of the inhibitor layer. FIG. 15 illustrates a cross-sectional view 1500 corresponding to some embodiments of act 2110.

At act 2112, an inter-level dielectric (ILD) layer is deposited over the dielectric capping layer and the plurality of conductive wires. FIG. 17 illustrates a cross-sectional view 1700 corresponding to some embodiments of act 2112.

At act 2114, an etching process is performed on the ILD layer to form an opening over an underlying conductive wire, where the ILD layer is etched more quickly than the dielectric capping layer during the etching process. FIG. 18 illustrates a cross-sectional view 1800 corresponding to some embodiments of act 2114.

At act 2116, an upper conductive via and an upper conductive wire are formed within the opening such that the upper conductive wire overlies the upper conductive via. FIGS. 19 and 20 illustrates cross-sectional views 1900 and 2000 corresponding to some embodiments of act 2116.

Accordingly, in some embodiments, the present application relates to a plurality of conductive wires overlying a substrate. A plurality of dielectric structures are spaced laterally between adjacent conductive wires, where each dielectric structure comprises an air-gap. And a dielectric capping layer disposed along an upper surface of the plurality of dielectric structures and laterally offset from the plurality of conductive wires.

In various embodiments, the present application provides a semiconductor structure including: an inter-level dielectric (ILD) layer overlying a substrate; a conductive via disposed within the ILD layer; a plurality of conductive wires overlying the ILD layer, wherein the plurality of conductive wires includes a first conductive wire laterally offset a second conductive wire, wherein the first conductive wire directly overlies the conductive via; a dielectric structure disposed laterally between the first and second conductive wires, wherein the dielectric structure includes a first dielectric liner, a dielectric layer, and an air-gap, wherein the air-gap is disposed between an upper surface of the first dielectric liner and a lower surface of the dielectric layer; and a dielectric capping layer disposed along an upper surface of the dielectric structure, wherein the dielectric capping layer continuously extends between opposing sidewalls of the dielectric structure, and wherein the dielectric capping layer is laterally offset from the plurality of conductive wires.

In various embodiments, the present application provides an integrated chip including: a first inter-level dielectric (ILD) layer overlying a substrate, wherein the first ILD layer has a first dielectric constant; a conductive via disposed within the first ILD layer; a conductive capping layer overlying the conductive via; a plurality of conductive wires overlying the first ILD layer; a plurality of dielectric structures spaced laterally between adjacent conductive wires, wherein each dielectric structure includes a first dielectric liner, a second dielectric liner, a dielectric layer, and an air-gap, wherein the first dielectric liner and the second dielectric liner are respectively U-shaped, wherein the air-gap is spaced between the first dielectric liner and the second dielectric liner, wherein the dielectric structures have a second dielectric constant that is less than the first dielectric constant; an etch stop layer overlying the plurality of conductive wires and the plurality of dielectric structures; a second ILD layer overlying the etch stop layer; an upper conductive via overlying the plurality of conductive wires and disposed within the second ILD layer; and a dielectric capping layer disposed along an upper surface of the plurality of dielectric structures, wherein the dielectric capping layer is disposed between the etch stop layer and the plurality of dielectric structures, wherein the dielectric capping layer is spaced laterally between opposing sidewalls of each dielectric structure, wherein the dielectric capping layer has a third dielectric constant that is greater than the first dielectric constant.

In various embodiments, the present application provides a method of forming a semiconductor device, including: forming a first inter-level dielectric (ILD) layer over a substrate; forming a conductive contact within the first ILD layer; forming a conductive layer over the first ILD layer; patterning the conductive layer to define a plurality of conductive wires such that a plurality of openings is spaced between the conductive wires; forming a plurality of dielectric structures in the plurality of openings, wherein each dielectric structure comprises a first dielectric liner, a second dielectric liner, a dielectric layer, and an air-gap; selectively depositing an inhibitor layer along an upper surface of the plurality of conductive wires such that the inhibitor layer is laterally offset from the plurality of dielectric structures; selectively depositing a dielectric capping layer along an upper surface of the plurality of dielectric structures, wherein the inhibitor layer is configured to prevent deposition of the dielectric capping layer along the upper surface of the plurality of conductive wires; and forming a conductive via over a first conductive wire in the plurality of conductive wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    an inter-level dielectric (ILD) layer overlying a substrate;
    a conductive via disposed within the ILD layer;
    a plurality of conductive wires overlying the ILD layer, wherein the plurality of conductive wires includes a first conductive wire laterally offset a second conductive wire, wherein the first conductive wire directly overlies the conductive via;
    a dielectric structure disposed laterally between the first and second conductive wires, wherein the dielectric structure comprises a first dielectric liner, a dielectric layer, and an air-gap, wherein the air-gap is disposed between an upper surface of the first dielectric liner and a lower surface of the dielectric layer; and
    a dielectric capping layer disposed along an upper surface of the dielectric structure, wherein the dielectric capping layer continuously extends between opposing sidewalls of the dielectric structure, and wherein the dielectric capping layer is laterally offset from the plurality of conductive wires.

2. The semiconductor structure of claim 1, wherein a dielectric constant of the dielectric structure is less than a dielectric constant of the dielectric capping layer.

3. The semiconductor structure of claim 1, wherein the dielectric capping layer comprises a dielectric material different than the dielectric structure.

4. The semiconductor structure of claim 1, further comprising:
an upper conductive via overlying the first conductive wire, wherein a lower surface of the upper conductive via continuously extends from an upper surface of the dielectric capping layer to an upper surface of the first conductive wire.

5. The semiconductor structure of claim 4, wherein the upper conductive via directly contacts the dielectric capping layer and directly contacts the first conductive wire.

6. The semiconductor structure of claim 1, wherein the dielectric structure further comprising a second dielectric liner disposed between the dielectric layer and the first dielectric liner, wherein the air-gap continuously extends from a lower surface of the second dielectric liner to the upper surface of the first dielectric liner.

7. The semiconductor structure of claim 6, wherein a height of the air-gap is greater than a height of the second dielectric liner and the dielectric layer.

8. The semiconductor structure of claim 7, wherein a width of the air-gap continuously decreases from the lower surface of the second dielectric liner in a first direction towards the substrate, wherein a width of the first conductive wire continuously increases from a top surface of the first conductive wire in the first direction.

9. The semiconductor structure of claim 1, further comprising:
an etch stop layer overlying the plurality of conductive wires, wherein the etch stop layer continuously extends from an upper surface of the second conductive wire, along a sidewall of the dielectric capping layer, to an upper surface of the dielectric capping layer.

10. An integrated chip comprising:
a first inter-level dielectric (ILD) layer overlying a substrate, wherein the first ILD layer has a first dielectric constant;
a conductive via disposed within the first ILD layer;
a conductive capping layer overlying the conductive via;
a plurality of conductive wires overlying the first ILD layer;
a plurality of dielectric structures spaced laterally between adjacent conductive wires, wherein each dielectric structure comprises a first dielectric liner, a second dielectric liner, a dielectric layer, and an air-gap, wherein the first dielectric liner and the second dielectric liner are respectively U-shaped, wherein the air-gap is spaced between the first dielectric liner and the second dielectric liner, wherein the dielectric structures have a second dielectric constant that is less than the first dielectric constant;
an etch stop layer overlying the plurality of conductive wires and the plurality of dielectric structures;
a second ILD layer overlying the etch stop layer;
an upper conductive via overlying the plurality of conductive wires and disposed within the second ILD layer; and
a dielectric capping layer disposed along an upper surface of the plurality of dielectric structures, wherein the dielectric capping layer is disposed between the etch stop layer and the plurality of dielectric structures, wherein the dielectric capping layer is spaced laterally between opposing sidewalls of each dielectric structure, wherein the dielectric capping layer has a third dielectric constant that is greater than the first dielectric constant.

11. The integrated chip of claim 10, wherein the second dielectric constant is less than or equal to 2.

12. The integrated chip of claim 10, wherein a width of the dielectric capping layer is greater than a minimum width of each dielectric structure.

13. The integrated chip of claim 10, wherein the upper conductive via continuously extends from an upper surface of the plurality of conductive wires, along a sidewall of the dielectric capping layer, to an upper surface of the dielectric capping layer.

14. The integrated chip of claim 10, wherein the dielectric capping layer is laterally offset from an upper surface of the plurality of conductive wires by a non-zero distance.

15. The integrated chip of claim 10, wherein the dielectric capping layer continuously extends along an upper surface of the first dielectric liner, an upper surface of the second dielectric liner, and an upper surface of the dielectric layer.

16. An integrated chip comprising:
a plurality of conductive wires overlying a substrate, wherein the plurality of conductive wires includes a first conductive wire laterally offset from a second conductive wire;
a dielectric structure disposed laterally between the first conductive wire and the second conductive wire, wherein the dielectric structure comprises a first dielectric liner, a second dielectric liner disposed between inner sidewalls of the first dielectric liner, and a dielectric layer over the second dielectric liner, wherein bottom surfaces of the second dielectric liner and the dielectric layer are vertically above a bottom surface of the first conductive wire;
a dielectric capping layer disposed along a top surface of the first dielectric liner, a top surface of the second dielectric liner, and a top surface of the dielectric layer; and
an etch stop layer over the dielectric capping layer, wherein the etch stop layer continuously extends from along sidewalls of the dielectric capping layer to a top surface of the dielectric capping layer.

17. The integrated chip of claim 16, wherein the dielectric structure further comprises an air-gap disposed between an upper surface of the first dielectric liner and a lower surface of the second dielectric liner.

18. The integrated chip of claim 16, wherein a width of the dielectric structure continuously decreases from the top surface of the dielectric layer in a first direction towards the substrate, and wherein a width of the first conductive wire continuously increases from a top surface of the first conductive wire in the first direction.

19. The integrated chip of claim 16, wherein a top surface of the dielectric structure is aligned with a top surface of the first conductive wire, and wherein a bottom surface of the dielectric structure is disposed vertically below the bottom surface of the first conductive wire.

20. The integrated chip of claim 16, wherein the dielectric capping layer directly contacts the top surface of the first dielectric liner and the top surface of the second dielectric liner.

* * * * *